US006926539B2

(12) United States Patent
Zaderej et al.

(10) Patent No.: US 6,926,539 B2
(45) Date of Patent: Aug. 9, 2005

(54) TERMINAL ASSEMBLY FOR HIGH-SPEED CONNECTOR

(75) Inventors: Victor Zaderej, St. Charles, IL (US); Kenneth M. Stiles, Barrington, IL (US); Kent E. Regnier, Lombard, IL (US)

(73) Assignee: Molex Incorporated, Lisle, IL (US)

(*) Notice: Subject to any disclaimer, the term of this patent is extended or adjusted under 35 U.S.C. 154(b) by 0 days.

(21) Appl. No.: 10/755,635

(22) Filed: Jan. 12, 2004

(65) Prior Publication Data

US 2004/0198077 A1 Oct. 7, 2004

Related U.S. Application Data

(62) Division of application No. 10/170,963, filed on Jun. 13, 2002, now Pat. No. 6,702,590.

(60) Provisional application No. 60/297,998, filed on Jun. 13, 2001.

(51) Int. Cl.[7] .......................... H01R 12/00; H05K 1/00

(52) U.S. Cl. .......................................... 439/74; 439/931

(58) Field of Search ............................. 439/74, 95, 931

(56) References Cited

U.S. PATENT DOCUMENTS 5,169,324 A * 12/1992 Lemke et al. ............... 439/101
5,928,003 A * 7/1999 Kajinuma .................... 439/74
6,338,630 B1 * 1/2002 Dong .......................... 439/74
6,347,950 B1 * 2/2002 Yokoyama et al. ......... 439/248
6,375,506 B1 * 4/2002 Saunders et al. ........... 439/607

* cited by examiner

*Primary Examiner*—Hae Moon Hyeon
(74) *Attorney, Agent, or Firm*—Thomas D. Paulius

(57) ABSTRACT

A board to board connector for use in high speed signal transmission applications includes male and female connector components that interengage with each other. Each of the male and female parts has an insulative housing that holds a plurality of individual terminal assemblies in cavities defined by corresponding walls of each connector component. The exterior surfaces of the connector components are plated with a metal so as to provide a unitary grounding datum around each of the individual terminal assemblies. Each of the connector components may utilize a center engagement member that runs lengthwise through the connector components, one of the center engagement members having a contact blade formed integrally therewith and the other of the center engagement members including a plurality of spring arms, also integrally formed with the connector component so that the grounding shield portions of the two connectors make contact with each other first before the terminals of the connector make contact.

21 Claims, 18 Drawing Sheets

FIG. 42
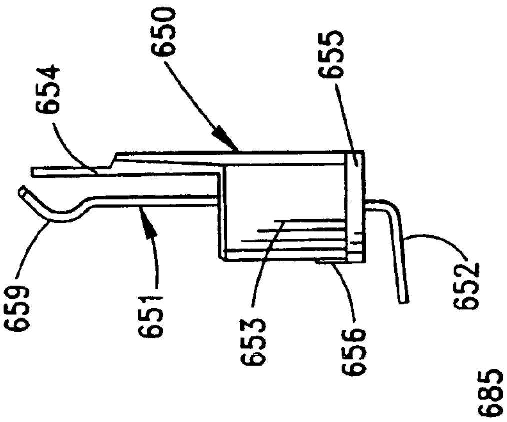
FIG. 41
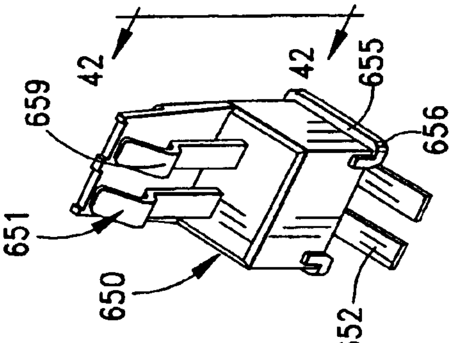
FIG. 40
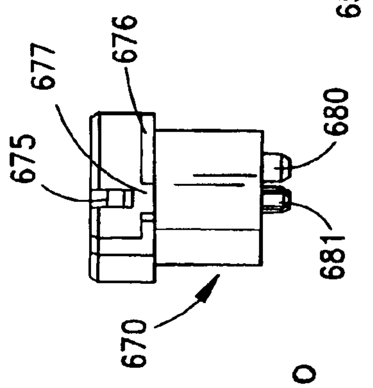
FIG. 39
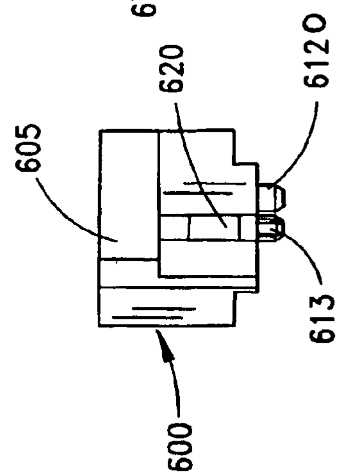
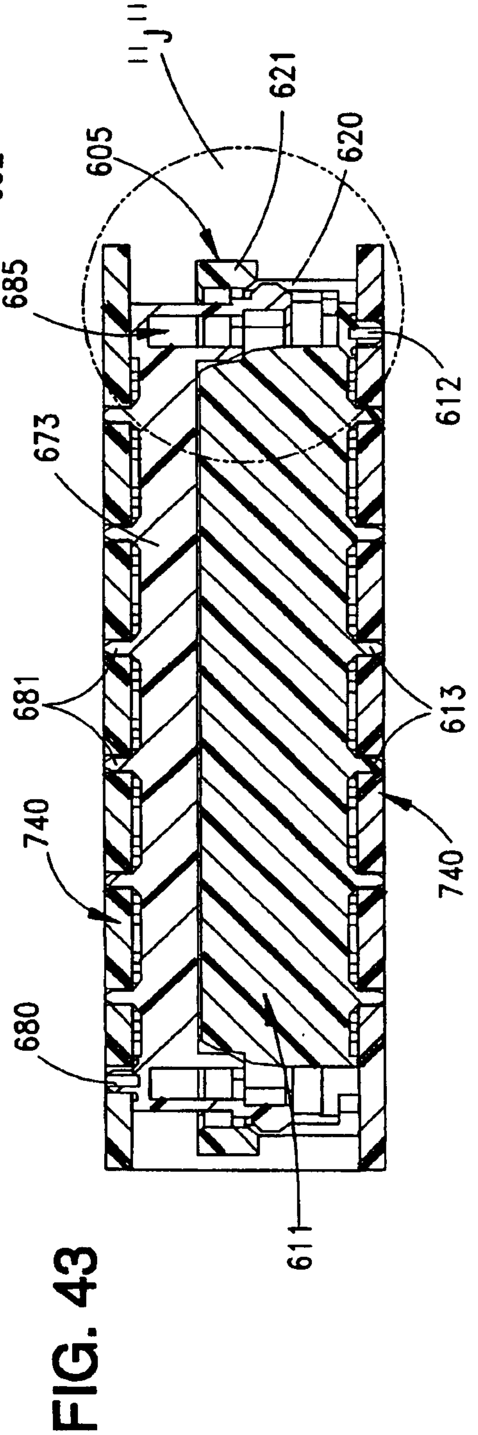
FIG. 43

TERMINAL ASSEMBLY FOR HIGH-SPEED CONNECTOR

REFERENCE TO RELATED APPLICATIONS

This is a divisional application of prior application Ser. No. 10/170,963, filed Jun. 13, 2002 now U.S. Pat. No. 6,702,590.

This application claims priority of U.S. Provisional Patent Application Ser. No. 60/297,998 filed Jun. 13, 2001.

BACKGROUND OF THE INVENTION

The present invention relates generally to high speed connectors, and more particularly to high speed mezzanine, or board-to-board connectors.

The electronics industry keeps improving the speed and efficiency of its devices not only in size but in speed of operation. In addition, increased emphasis is being placed on reducing the cost of components in the electronics industry, including the cost of connectors. In order to facilitate the manufacture of these devices, connectors are required that operate at high speeds. Typical construction of high speed connectors involves the use of individual metal shields that may be mounted along one or both sides of a connector. Signal terminals are usually mounted inside the connector housing and spaced from the shield. This construction involves the forming and mounting of a separate shield, which adds to the cost of the connector. The use of external shields also may increase the size of the connector, thus defeating the aim of reducing the size of the connector. The use of external shields also requires that the two housings overlap and thus increases the overall size of the connector structure. A need therefore exists for a low cost connector having a structure suitable for high speed use and which may be used in board-to-board applications.

The present invention is directed to a high-speed connector that overcomes the aforementioned disadvantages.

SUMMARY OF THE INVENTION

Accordingly, it is a general object of the present invention to provide an improved high speed connector for board to board applications.

Another object of the present invention is to provide a board-to-board connector having interengaging plug and receptacle members that are plated with a conductive coating in a manner so as to form a common shield, or ground plane, extending over selected surfaces of the plug and receptacle members, the plug and receptacle members having a plurality of individual compartments, each of which contains a pair of differential signal terminals.

Yet another object of the present invention is to provide an improved connector for use in board-to-board or mezzanine applications wherein exterior surfaces of the connector are plated with a metal plating so as to define a reference ground or grounding shield on the connector without the need for a separately formed grounding shield.

A further object of the present invention is to provide an improved shielded connector for board-to-board applications in which the connector includes first and second parts that mate together to form a single unit, each of the two parts including a housing having a plurality of cavities formed therein, each of the cavities including a dielectric insert, each insert including at least a pair of differential signal terminals adapted for termination to corresponding conductive traces on a circuit board, the connector parts further including interengagement means formed therewith and extending lengthwise thereof.

Still another object of the present invention is to provide a connector of the type previously described wherein the interengaging means includes a plurality of recesses, or cavities, formed in the sidewalls of one of the parts, the recesses being separately of intervening columns, and a plurality of spring fingers, or projections, formed in the sidewalls of the other of the two parts, the spring fingers being received within corresponding recesses of the other part, and the interengaging means being coated with a conductive material so that a ground connection is made and maintained when the two connector parts are engaged together such that the pairs of differential signal terminals held in each cavity are electrically shielded, or enclosed by a reference ground, throughout the height extent of the connector.

Yet another object of the present invention is to provide a board to board connector having male and female connector components that interengage with each other, each of the male and female parts including an insulative housing that holds a plurality of individual terminal assemblies therein in cavities that are defined by corresponding walls of the connector components, the exterior surfaces of the two connector components being plated with a metal so as to provide a unitary grounding datum around each of the connector assemblies along substantially all of the surfaces of the connector components, each of the two connector components including a center engagement member that runs lengthwise through the connector components, one of the center engagement members having a contact blade formed integrally therewith and the other of the center engagement members including a plurality of spring arms, also integrally formed with the connector component so that the grounding shield portions of the two connectors make contact with each other first before the terminals of the connector do.

Still a further object of the present invention is to provide a board to board connector having two connector components that are matable with each other, and wherein the connector components include a plurality of terminal assemblies disposed therein, but electrically isolated from each other by grounding portions applied to exterior surfaces of the connector components, the two connector components being blind matable and being capable being zippered into and out of engagement with each other.

The present invention accomplishes these and other objects by way of its structure. In one principal aspect of the present invention and as exemplified by a first embodiment thereof, the connector assembly of the invention includes a pair of interengaging connector halves. Each connector half is formed as a housing from a dielectric material and has an elongated body portion defined by two opposing walls and two parallel sidewalls. In another principal aspect, a plurality of individual cavities are formed in each of the connector halves, with the connector half sidewalls defining sides of some of the cavities and cross walls defining other portions of the cavities. Each cavity contains a terminal insert that preferably takes the form of a dielectric body with at least a pair of conductive signal terminals therein that are adapted at one end, for mating to a circuit board and at the other end, for mating with corresponding opposing terminals in the other connector half. Each such pair of differential terminals is enclosed within each cavity and when the two connector halves are engaged together the pairs are fully enclosed within their respective cavities. The connector halves are preferably plated with a conductive material on all their exposed surfaces so that the conductive material forms an electrically-conductive shield around each cavity, thereby providing a grounding interface between and around the discrete pairs of wires.

In another important aspect of the invention, each of the connector halves is provided with interengaging means that preferably extend lengthwise along the connector halves. In one embodiment, these interengaging means run lengthwise along the sidewalls of the connector halves so that the engagement occurs along the sides. In another embodiment, these interengaging means extend lengthwise along central walls of the two connector halves so that the engagement occurs along the center of the connector.

The interengagement means preferably utilizes a press fit type of engagement and in one embodiment, takes the form of recesses formed in the connector halves and opposing resilient engagement arms, pairs of which are received within each recesses. The arms are slightly larger in spacing than the recesses and are split by an interengaging slot that provides them with a measure of resiliency so that they are slightly compressed when received by corresponding opposing recesses. Both the arms and recesses are conductively plated so that reliaable electrical contact is made within the plane of the engagement means to ensure electrical isolation of the differential signal terminals held in the connector cavities from other differential signal pairs.

In still another embodiment of the invention, the interengagement means extends down a general centerline of the two connector halves and includes a contact blade in one half and a plurality of spring arms in the other connector half.

By applying the conductive material to all the connector surfaces near the cavities, including the interengaging recesses and engagement arms, each pair of differential signal terminals is fully encompassed by a shield which will improve its performance and result in a quieter connector from the electrical standpoint—electrical "noise" does not enter the cavities and electrical noise will not exit the cavities. The press-fit contact between the engagement arms and the recesses maintains the integrity of the ground connection within the plane of the connector sidewalls.

In another embodiment of the invention, the connector halves are designed so that one is easily inserted into the other in a "zippering" fashion, that is, one end of one connector half may be inserted into the other end of the other connector half and the one connector half may be then pivoted or rocked into place and engagement with the other connector half. In this embodiment, the other connector half preferably includes a continuous, outer skirt that is integrally formed therewith and which has a height sufficient to extend up past the mating face of the one connector half so as to provide effective and additional shielding in the mating interface region of the two connector halves.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which:

FIG. 39 is an end elevational view of the connector component of FIG. 33, taken along lines 39—39 thereof;

FIG. 40 is an end elevational view of the connector component of FIG. 36, taken along lines 40—40 thereof;

FIG. 41 is a perspective view of a terminal assembly used in the connector components of FIGS. 33 and 36;

FIG. 42 is an elevational view of the terminal assembly of FIG. 41, taken along lines 42—42 thereof;

FIG. 43 is a sectional view taken longitudinally along a center line of both the connector components of FIGS. 33 and 36 after assembly together into an assembly interconnecting two circuit boards together;

DETAILED DESCRIPTION OF THE PREFERRED EMBODIMENTS

Figures 1, 2:
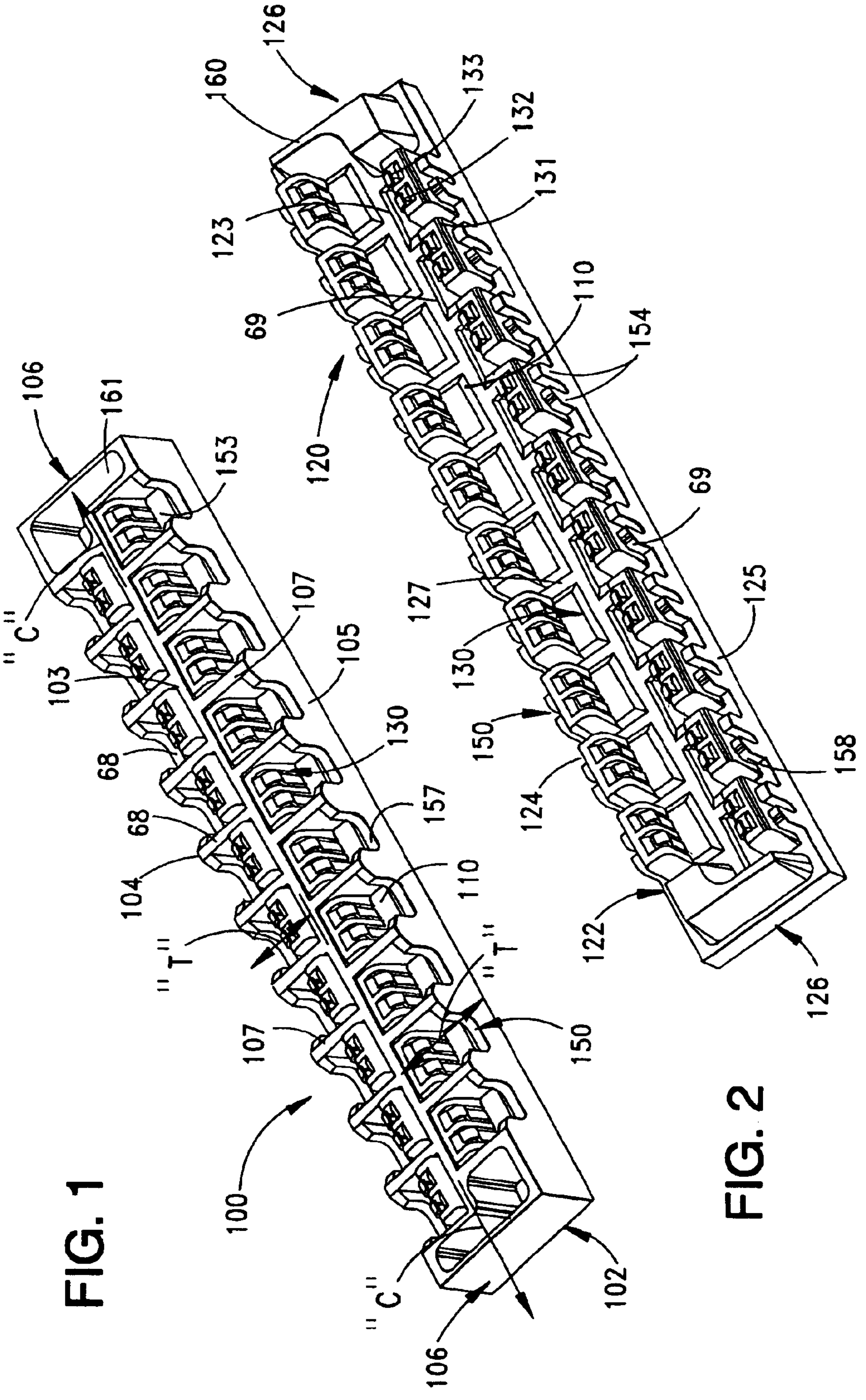
FIG. 1 is a perspective view of a receptacle connector component constructed in accordance with the principles of the present invention.
FIG. 2 is a perspective view of a plug connector component constructed in accordance with the principles of the present invention and designed to interengage the receptacle connector component of FIG. 1.

FIG. 1 illustrates a receptacle connector component 100 and FIG. 2 illustrates plug connector component 120, both of which are constructed in accordance with the principles of the present invention. Each component includes an insulative housing, 102, 122. Each housing has a respective center wall 103, 123 that runs for substantially the entire length of the connector housing, and also has a pair of side walls 104, 105 and 124, 125. These walls all terminate at ends 106, 126 of the connector components. A plurality of intervening walls 107, 127 extend transversely from the center walls 103, 123 to the side walls and cooperatively define, with the center and side walls of the connector components, a plurality of cavities, or openings 110, arranged lengthwise along the connector housing. As shown in FIGS. 1–5, these cavities 110 are staggered with respect to each other on opposite sides of a longitudinal centerline C of the connector component, meaning usually that the transverse center line T of a cavity on one side of the center wall is aligned with the intervening wall 107, 127 on the other side of the center wall.

Figure 16:
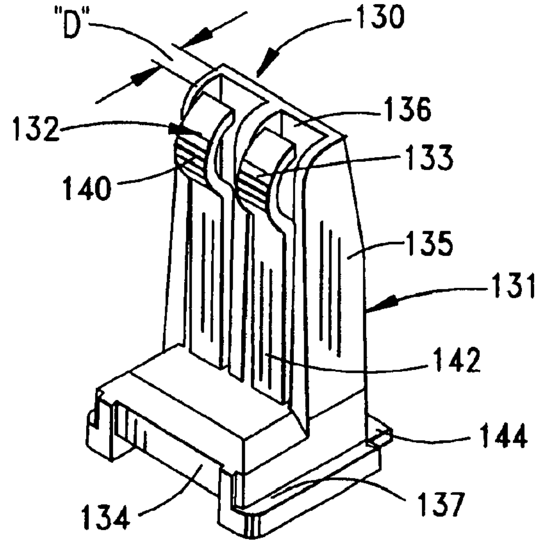
FIG. 16 is a perspective view of a terminal insert assembly used in the connector component of FIG. 11.
Figure 17:
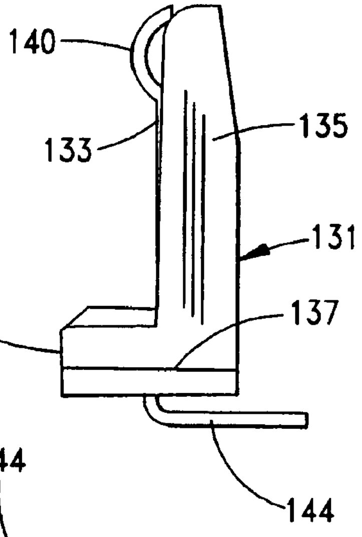
FIG. 17 is a side elevational view of the terminal insert assembly of FIG. 16.
Figure 18:
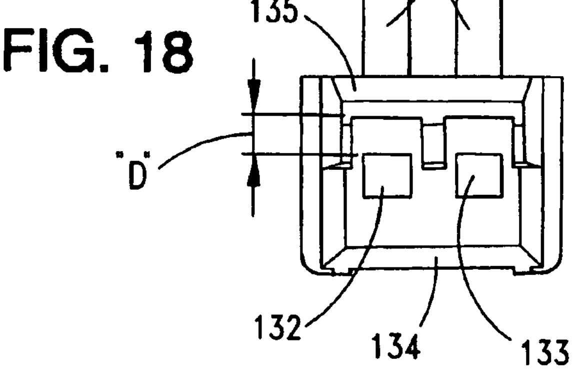
FIG. 18 is a top plan view of the terminal insert assembly of FIG. 16.

Each cavity 110 preferably receives a single terminal insert assembly 130, with the assembly 130 including a dielectric body 131 and also preferably, a pair of differential signal terminals 132, 133. One type of terminal insert assembly 130 utilized in the connectors of the invention is illustrated in FIGS. 16–18. As seen in these Figures, the body portion 131 of each assembly may have a general L-shape with a base portion 134 and an upstanding wall portion 135 that may include one or more slots 136 extending therein that partially house a conductive terminals 132, 133. The terminals 132, 133 may be stitched into the assembly body 131, and then bent in the "L"-shape illustrated, or they may be formed as is known in the art by stamping or forming them on a carrier strip (not shown) which may then be inserted into a mold cavity and the assembly body molded therearound.

No matter what assembly process is used, the terminals 132, 133 preferably are vertically cantilevered and may be formed with a slight outward bias, so that the contact portion 140 of the terminals 132, 133 typically will extend away from the upstanding wall 135 of the terminal assembly 130. This is illustrated best as distance D in FIGS. 16 and 18. The contact portions 140 may be formed as semi-circular shapes, or any other desirable shapes, and preferably formed at the top of the body portions 142 of the terminals 132, 133. The terminals 132, 133 also include tail portions 144 that may be bent at an angle as illustrated for surface mount applications, or they may extend straight for through hole mounting applications.

The terminal assembly body 131 is preferably formed from a dielectric material that will assist in isolating the two terminals from two other terminals in the connection. In the preferred embodiment of the invention that is illustrated in FIGS. 11–18, the connector is intended to be terminated to circuit traces that carry differential signals and each such pair of signals will form a differential pair of traces, or wires that preferably carry the same magnitude of voltage but with different polarities, i.e., +0.5 volts and −0.5 volts. It is known that in order to ensure high speed transmission through differential signal pairs, a ground reference, or terminal, should be provided. The use of this ground reference provides isolation between differential signal terminals and is typically accomplished in the prior art board to board connectors by utilizing a separate conductive shield that is applied to one of the connector housing surfaces. Not only does this extra component increase the cost of manufacture and assembly of the connectors, but it also increases the size of the connector. The present invention avoids the use of a separate conductive ground member, or shield, and provides reliable electrical isolation between differential signal terminals that enhances the speed of transmission therethrough.

Figure 3:
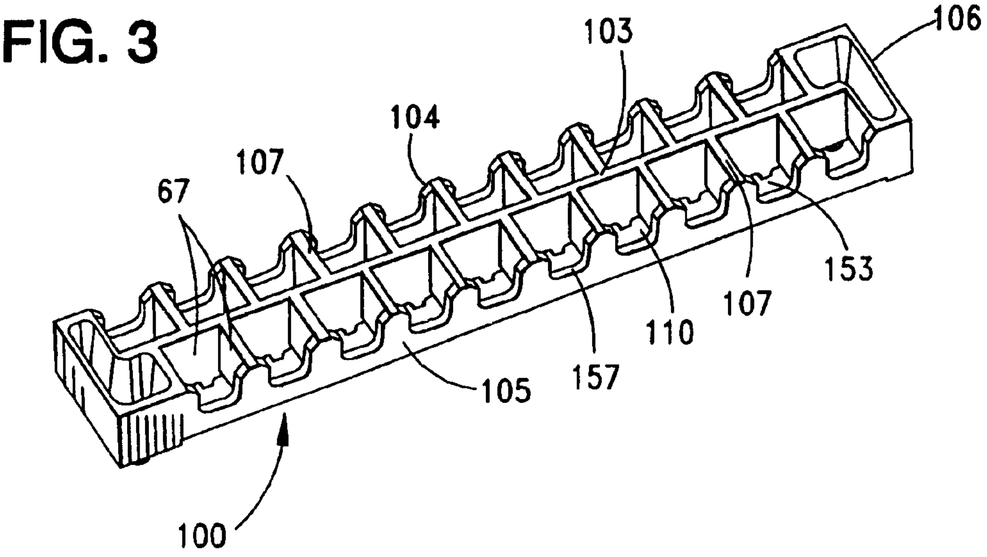
FIG. 3 is the same view as FIG. 1, but with the terminal inserts removed from the connector component for clarity.
Figure 4:
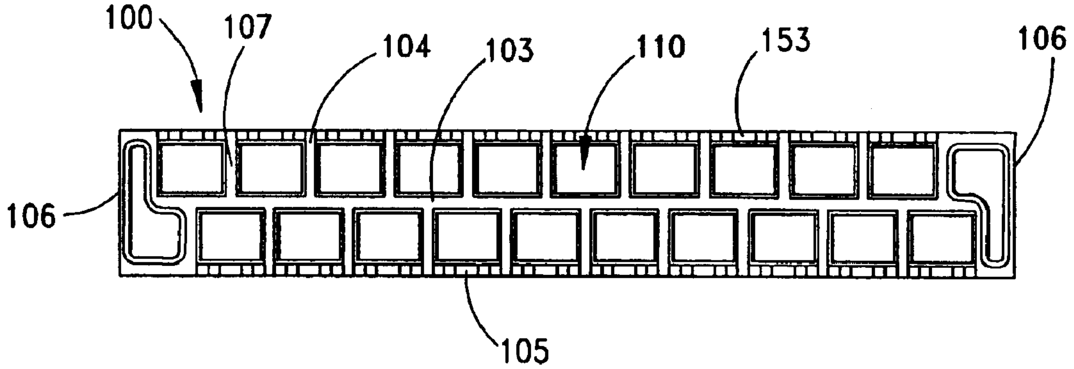
FIG. 4 is a top plan view of the connector housing of FIG. 3.
Figure 5:
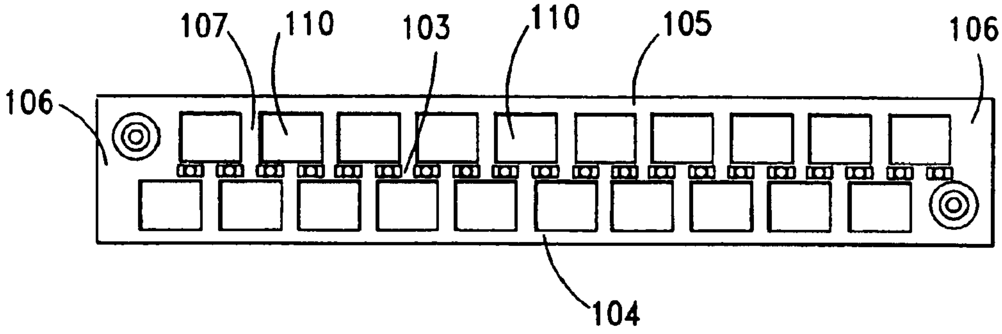
FIG. 5 is a bottom plan view of the connector housing of FIG. 3.

The present invention accomplishes this by plating surfaces of the connector components, rather than adding a separate shield member. Preferably, the entire connector is plated over all of its exterior surfaces. However, the connector may be selectively plated in desired areas which will encompass the desired terminal assemblies and extend to a ground connection, such as a circuit pad or trace, on a circuit board. As seen in FIGS. 3–4, the connector component 100 has a plurality of cavities 110. Each such cavity 110 preferably receives a terminal assembly 130 therein as illustrated in FIGS. 1 and 2. When the terminal assemblies 130 are held in the cavities 110, the various walls of the connector component 100 that cooperatively define the cavities 110 serve to encompass, or surround, their corresponding terminal assemblies 130. These walls are plated in the present invention in order to provide a continuous conductive ground structure that extends around the differential terminals.

In the embodiment illustrated in FIGS. 1–7, the connector components 100, 120 are further provided with an engagement means by which the two connector components may be interengaged together and these engagement means 150 are illustrated as extending lengthwise along the side walls 104, 105, 124, 125 of the connector components 100, 120. As illustrated in FIG. 3, one of these engagement means 150 takes the form of a plurality of spaced-apart recesses 153 that extend in the sidewalls 104, 105. As illustrated, these recesses are preferably aligned with the cavities 110 and are disposed between the transverse walls 107 and the two end walls 106 of the connector component. Each recess has a predetermined width W1.

Figure 6:
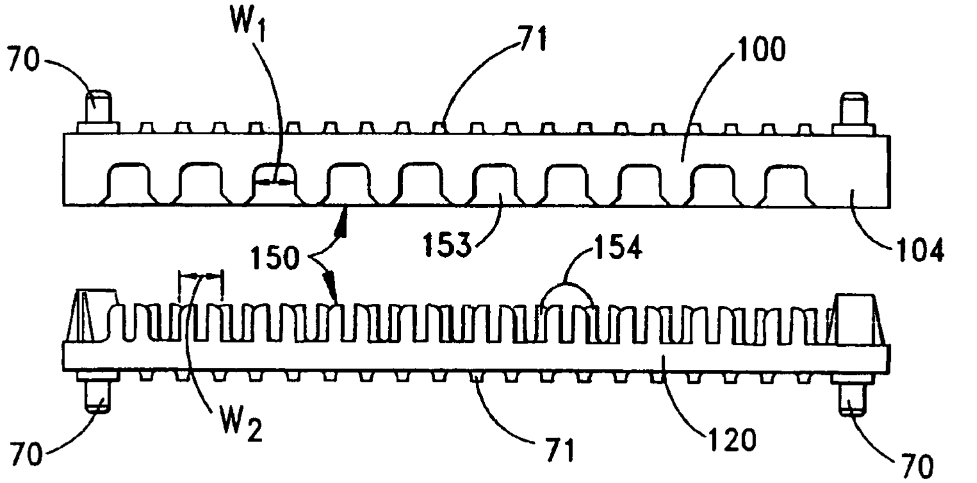
FIG. 6 is a side elevational view of a plug and receptacle connector housings aligned together for eventual mating.
Figure 7:
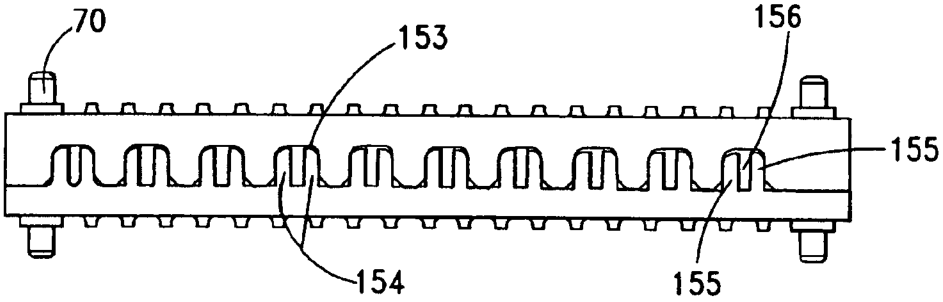
FIG. 7 is a side elevational view of the connector housings of FIG. 6, illustrated in a mated condition.

As best illustrated in FIGS. 2, 6 and 7, the other connector component 120 has its engagement means 150 in the form of a plurality of engagement arms or spring arms 154 that are fanned in pairs and which are disposed on the side walls 124, 125 of the connector component 120 in spaced-apart order and which are aligned with the recesses 153. Each set of spring arms 154 has a pair of spaced-apart arms 155 that are separated by an intervening slot 156. This slot 156 permits the spring arms 154 to be moved toward each other when the are inserted into corresponding opposing recesses 153. As such, the set of spring arms 154 may be formed with a predetermined width W2 that may be slightly greater than the width W1 of the recesses 153. This ensures that a good frictional fit or a press-fit results when the two connectors are engaged together as shown in FIG. 7. The widths W1, W2 can also be made the same during initial molding of the connector components and when the connector components 100, 120 are subsequently plated, the width W1, of the recesses 153 will diminish, while the width W2 of the spring arms 154 will increase. The plating applies a layer of conductive material to the underlying housing, typically a dielectric material such as plastic, which increases and decreases the widths W1, W2 by the thickness of the plating layer. The movement of the spring arms 154 occurs in longitudinal direction, preferably parallel to the longitudinal centerline C of the connector component. The force that each pair of spring arms 154 exerts on its corresponding recess may be multiplied by the total number of spring arm pairs to obtain an approximate total retention force between the two connector components.

As illustrated, the plating layer will cover both the inner surfaces 157 of the recesses 153 (FIGS. 1 and 3) as well as the outer surfaces 158 of the spring arms 154. In this manner, these two surfaces 157, 158 will engage and contact each other in a face-to-face contact as shown in FIG. 7. This contact establishes an electrical connection between the two connector components 100, 120 which is accomplished by way of the conductive plating. The other surfaces of the connector components 100, 120 also preferably meet in abutting, or face-to-face contact, such as along the center walls 103, 123 to further reinforce the ground connection.

Figure 22:
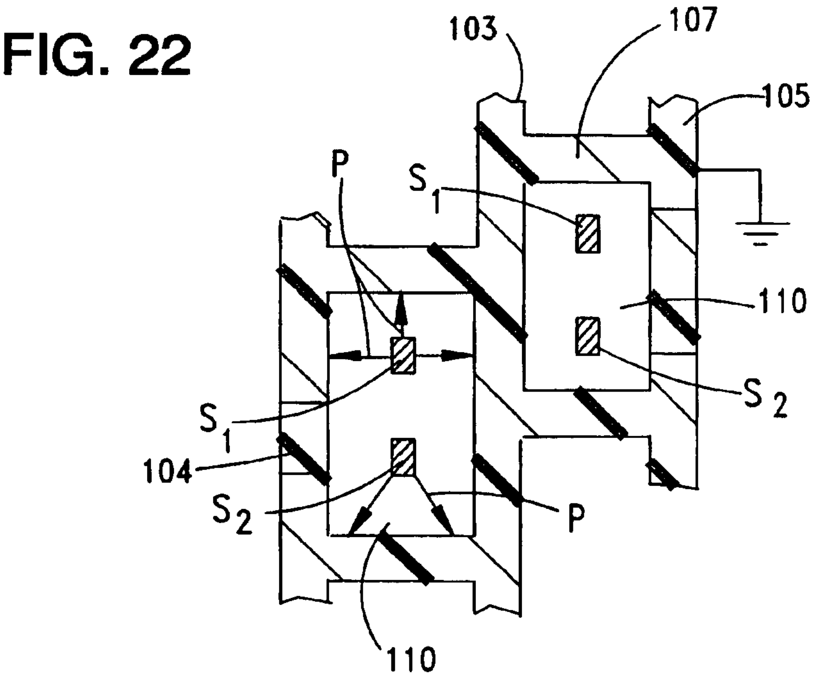
FIG. 22 is a schematic view of a section of a connector showing the electrical relationship.

With the exterior surfaces of the connector components 100, 120 plated with a conductive coating each differential terminal pair is, in effect, "enclosed" or "encompassed" by a ground reference. This is shown schematically in FIG. 22, wherein a cross-section is illustrated of two adjacent, staggered connector component cavities 110, each of which has a pair of differential signal terminals $S_1$, $S_2$ disposed therein. The signal terminals $S_1$, $S_2$ are spaced apart from each other but are surrounded on four sides by the walls 103, 104, 105 and 107 that are spaced a preselected distance therefrom, shown as "P" in the drawing. The length of P will vary with the location of the terminal and the location of the cavity wall, but it will be noted that each terminal has at least three conductive walls near it and a fourth wall spaced farther away from it than the rest at the holes, which wall is the cross or transverse wall 107 that lies farthest from each terminal. In this regard, it is contemplated that at a minimum, the interior surfaces 67 and the exposed mating surfaces 68 and 69, will be plated, along with the circuit board engagement posts 70 and standoffs 71. This will provide the least amount of ground surfaces that will provide the benefits of shielding. Economics of the plating process may dictate that all exposed surfaces of the two connector components 100, 120 be plated.

Figure 21:
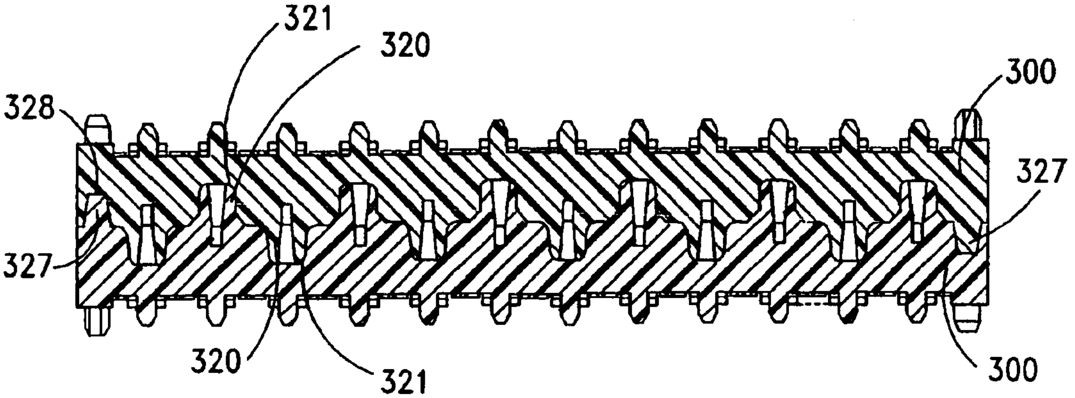
FIG. 21 is a lengthwise sectional view of a pair of connector components of the type illustrated in FIG. 11 mated together.

FIGS. 7 and 21 illustrate how the mechanical engagement features of the connector components also provide the desirable "encompassing" shields. This is done by way of the spring arms 154 extending into each corresponding recess 153 50 that they substantially close off the recesses 153 except for the intervening slot 156 between the spaced-apart arms 155. This structure substantially closes off the fourth wall of each cavity and whereas the size of the slot in each cavity is small enough compared to the overall extent of conductive material on the connector component that surrounds each cavity. The slot has no negative effect on the electrical isolation that is derived from the extent of the conductive plating. FIG. 21 is a lengthwise cross-section of two connectors of a style similar to FIG. 13 mated together.

In order to provide a means for polarizing or "keying" the two connector components 100, 120 together, they may include projecting posts 160 and hollow slots 161 that interengage each other in a manner known in the art. In this type connector, the terminal insert assemblies 130 may be arranged in one connector component 100 facing outwardly as shown in FIG. 1, and arranged in the other connector component 120 facing inwardly as illustrated in FIG. 2. This type arrangement is demonstrated in FIG. 14, wherein two terminal insert assemblies 130 are seen in place in respective cavities 301 on opposite sides of the center wall 302 with their terminals 132, 133 facing inwardly and toward each other. In this manner, the terminals 132, 133 will contact each other in a face-to-face manner in a cross-wise direction of the connector assembly.

Figure 15:
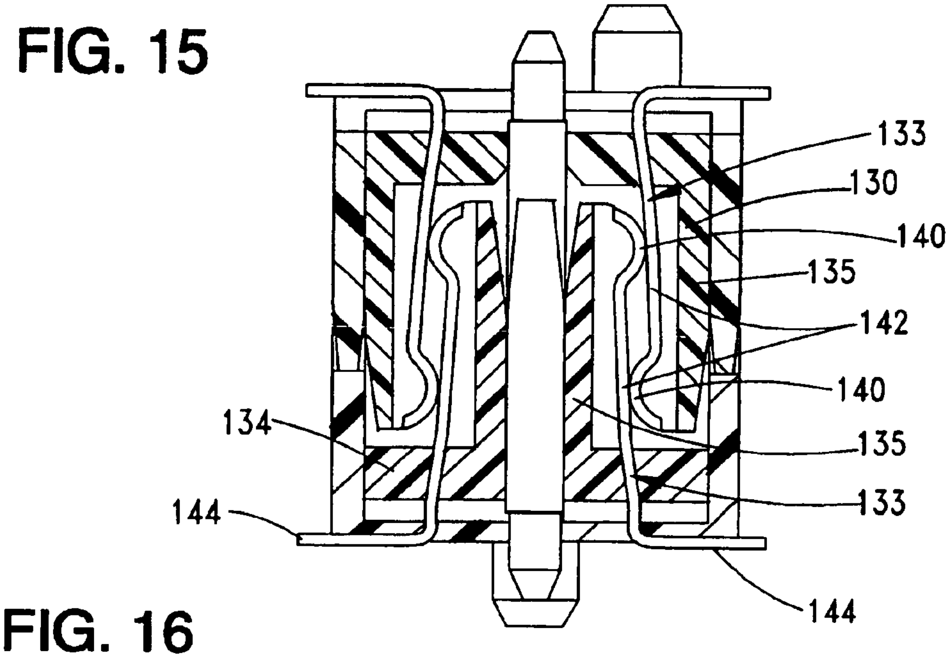
FIG. 15 is a transverse section view of two connector components of FIG. 11 interengaged together.

This contact is illustrated best in FIG. 15, where it can be seen that the terminal assemblies of one connector component 100 are arranged as in FIG. 1 with the back walls 135 thereof aligned in an "inwardly" fashion, that is along the center wall 103 of the connector component 100, while the terminal assemblies of the other connector component 120 are aligned in an "outwardly" fashion, that is, along the side walls 124, 125 of the connector component 120. This causes the terminals 132, 133 to face each other and when engaged, the opposing contact portions 140 of the terminals will ride over each other and bear against the terminal body portion 142. The terminal body portions 142 and contact portions 140 extend out from the terminal assembly base 134 at a slight angle away from the back walls 135 thereof so that an effective frictional contact is made and maintained between the opposing contacts. The slots 136 of the terminal assemblies 130 permit the terminals 132, 133 to move therein when the connector components, 100, 120 are engaged together. This engagement will also serve to maintain the two connector components mated together although it will be understood that the primary engagement effected between the two connector components is attained by the alternating spring arms and recesses described above. Although the terminal inserts or assemblies 130 are shown aligned with each other lengthwise on opposite sides of the center lines of the connector components, it will be understood that they may be staggered on either one or both sides of the centerline so that one assembly faces inwardly, the other outwardly, the other inwardly and so forth.

Figure 8:
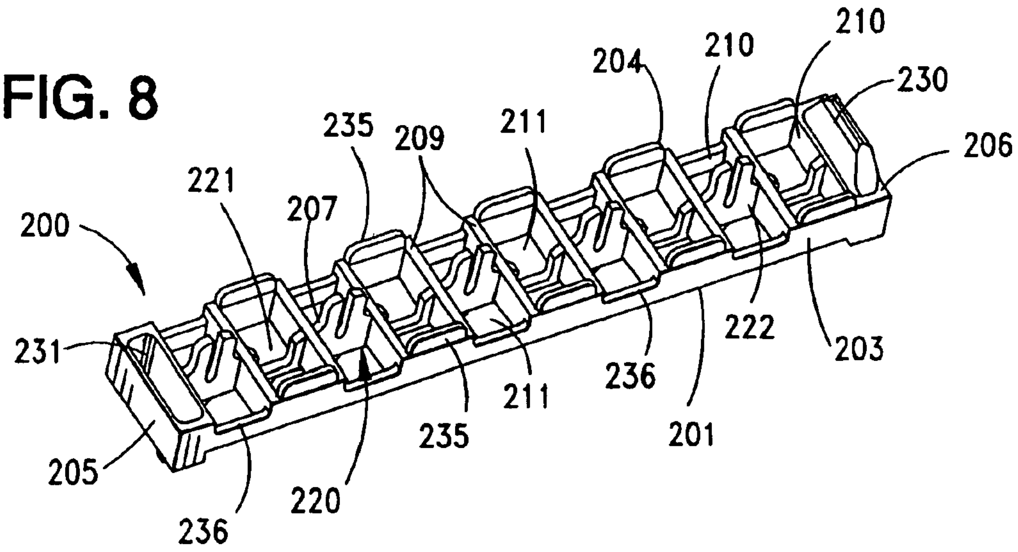
FIG. 8 is a perspective view of another embodiment of the connector component constructed in accordance with the principles of the present invention illustrating a hermaphroditic connector component with its interengaging means extending down the center of the connector component.
Figure 9:
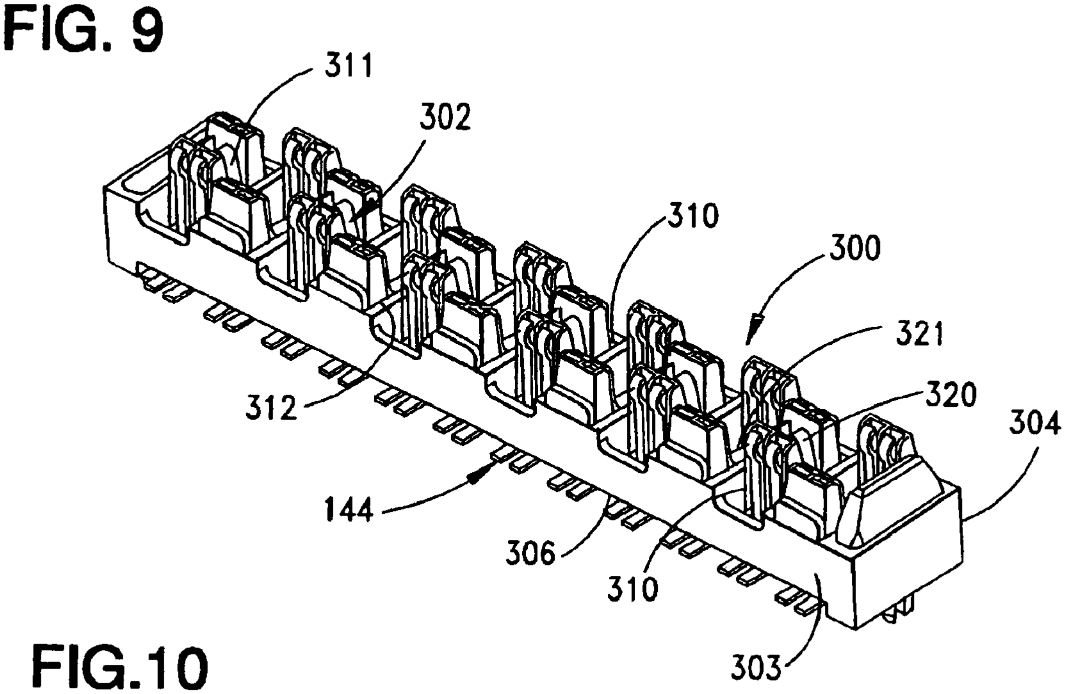
FIG. 9 is a perspective view of the connector component of FIG. 8 but with terminal inserts in place.
Figure 10:
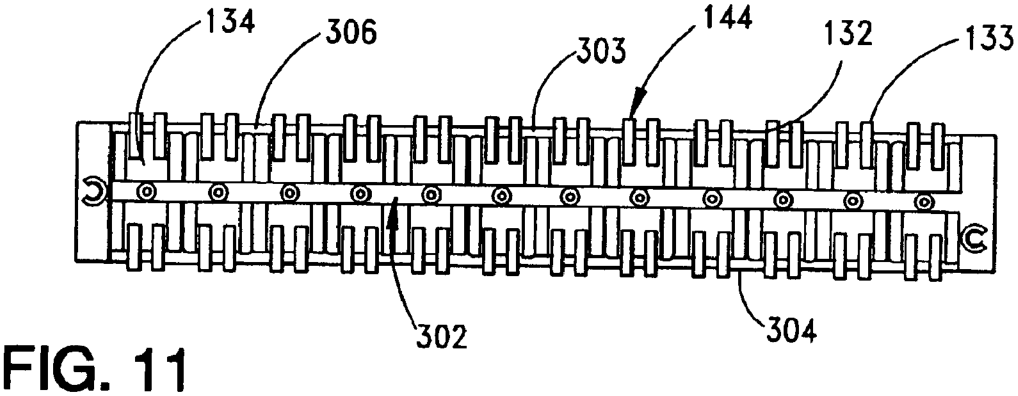
FIG. 10 is a bottom plan of the connector component of FIG. 9.
Figure 11:
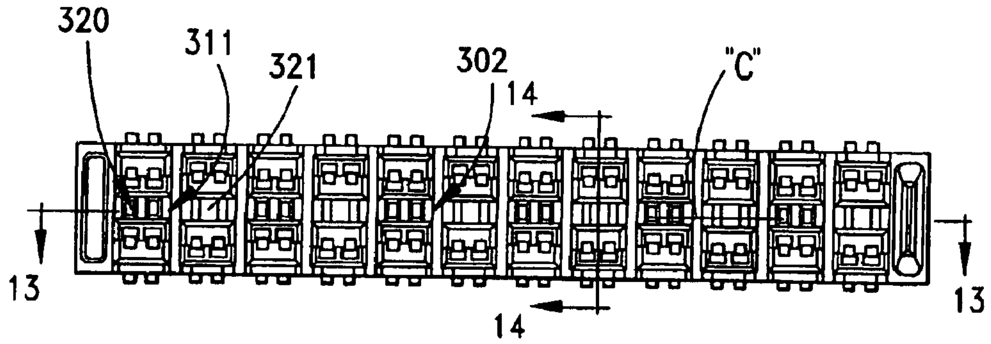
FIG. 11 is a top plan view of the connector component of FIG. 9.
Figure 12:
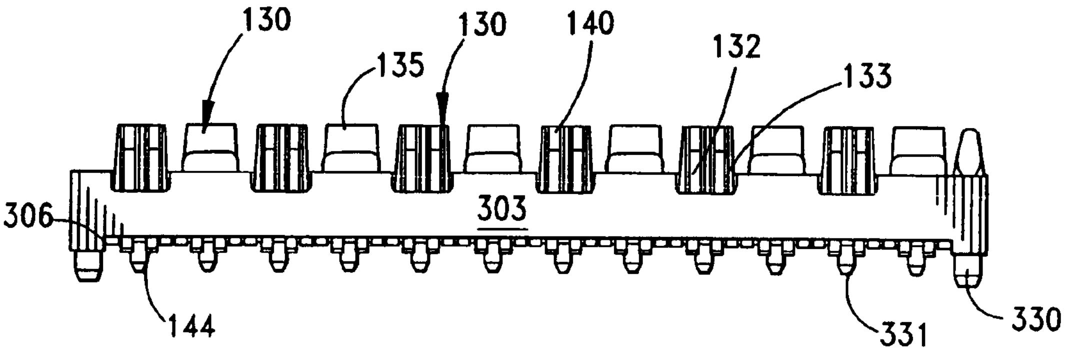
FIG. 12 is a side elevational view of the connector component of FIG. 9.

FIG. 8 illustrates a hermaphroditic connector component 200 that includes a dielectric, insulative housing 201 defined by a pair of side walls 203, 204 and two end portions 205, 206. A series of transverse walls 209 extend between the side walls 203, 204 and define compartments, or sections 210, of the connector housing. These compartments are further subdivided into two subcompartments 211 by a center wall 207 that may either be one single wall or a series of segments that bridge the gap between two transverse walls 209 or the end walls 205, 206. In the embodiment 200, the engagement means 220 is disposed along the center of the connector component 200, and preferably along the center wall 207 thereof. These engagement means 220, includes alternating recesses 221 and spring arms 222. The keying, or polarizing feature, of this connector 200 includes projections 230 at one end of the connector component and cavities 231 at the other end. These "keys" extend cross-wise of the connector housing and therefore the same component can be used for each connector half, except rotated 180° from the other component. The connector housing may further include alternating tongues 235 and grooves 236 formed in the sidewalls 203, 204 of the connector component 200. In the connector component 200, illustrated in FIG. 8, two such components may be used to provide a connection between two opposing circuit boards, rather than one style of connector component used for one of the two circuit boards and another style connector component used for the other of two circuit boards.

Furthermore, in the hermaphroditic style connectors of the invention, the engagement means may be disposed along the center of the connector component 200 as illustrated. Another embodiment of such a connector component is shown generally as 300 in FIGS. 9–15. In this style connector 300, the terminal assembly inserts 130 are arranged in cavities 301 an offset manner on opposite sides of the centerline "C" (FIG. 11) so that set of terminal assemblies that are adjacent each other lengthwise face in opposite directions. Similarly, adjacent crosswise sets of terminal assemblies face outwardly and inwardly in an alternating fashion. The sidewalls 303, 304 of this style connector may have elongated recesses 306 formed therein so that the terminals 132, 133, especially their tail portions 144 extend therethrough outwardly along the sides of the connector components. The terminal assemblies 130 may be stitched or otherwise inserted from the bottom into the cavities 310 of the connector 300. The base portions 134 of the terminal assemblies 130 may be provided with shoulder portions 137 that meet against the bottom surfaces of the connector component 300, such as the sidewalls 303, 304, the center wall 311 and the cross walls 312 thereof. In this embodiment, the mechanical equipment means also includes alternating spring arms 320 and recesses 321. This is best illustrated in FIG. 13.

Figure 13:
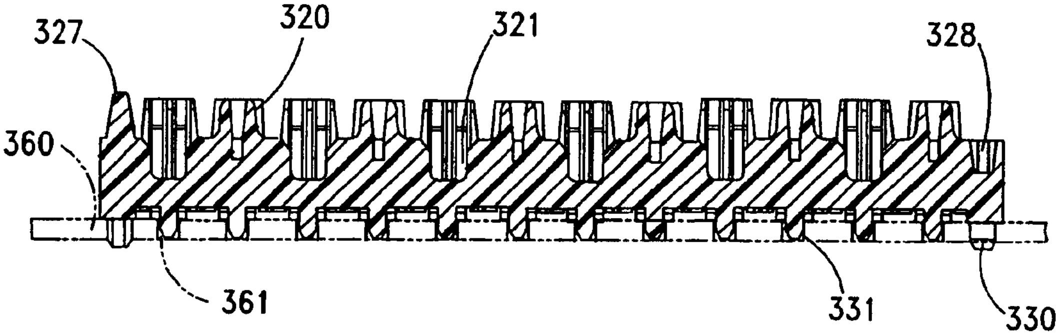
FIG. 13 is a lengthwise sectional view of the connector component of FIG. 11, taken along lines 13—13 thereof.
Figure 14:
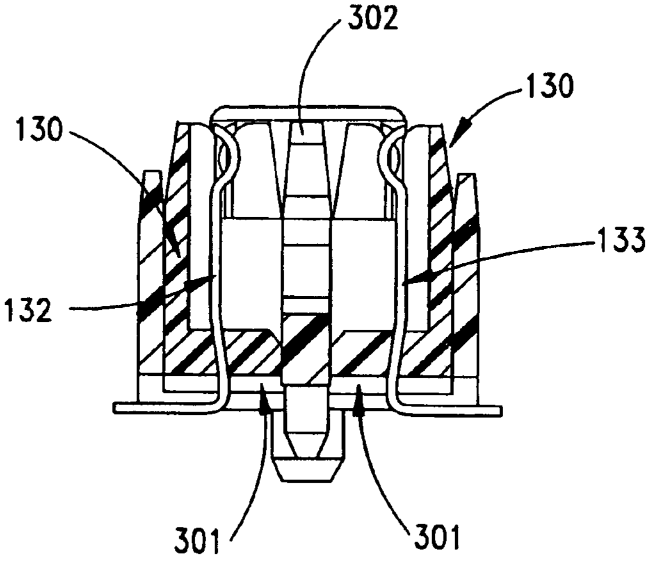
FIG. 14 is a transverse section view of the connector component of FIG. 1, taken along lines 14—14 thereof.

In order to provide a reliable ground connection, the connector component 300 may preferably have its mounting parts 330 and ground parts 331 plated with a conductive material so that they may be inserted into vias, or holes, 361 formed in a circuit board 360 shown in phantom FIG. 13) to thereby establish an electrical connection between the connector housing and the ground circuitry on the circuit board 360.

FIG. 21 illustrates two such connector components 300 mated together and is a sectional view that highlights the manner of connection between the two connector components 300. The alternating spring arms 320 and recesses 321 interengage each other and the opposing exterior surfaces of these features abut each other so that electrical contact is made along the mating interface, as well as along the locating keys 327 and recesses 328.

Figure 19:
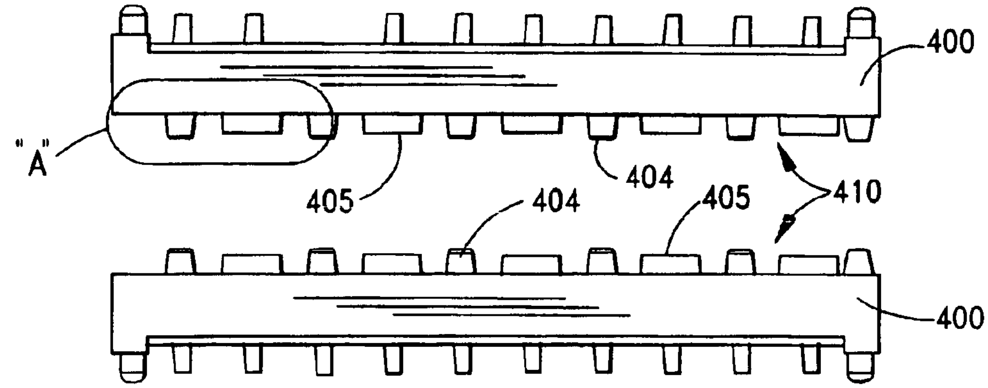
FIG. 19 is a side elevational view of another embodiment of a connector assembly constructed in accordance with the principles of the present invention illustrating two hermaphroditic connector components aligned in opposition with each other for external mating.
Figure 20:
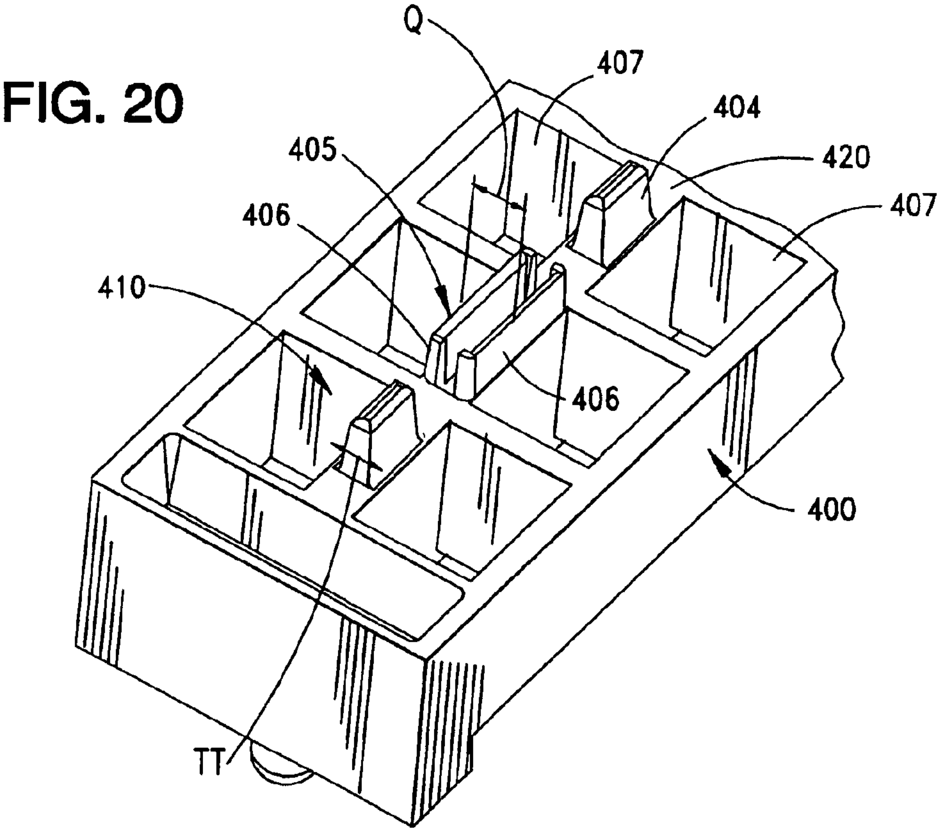
FIG. 20 is an enlarged detail view of area "A" of FIG. 19, illustrating a portion of mating face of one of two connector components.

FIGS. 19 and 20 illustrate another embodiment of a suitable engagement means 410 incorporated into a board to board connector component 400. These engagement means 410 run lengthwise along the center wall 420 of the connector component between the terminal-assembly-receiving cavities 407 and include alternating keys 404 and spring arm members 405. This embodiment differs from those previously described in that the spacing "Q" between the arms 406 of the spring arm member 405 is preferably less than the thickness "TT" of the keys 404, which may be tapered, as illustrated. This provides a suitable press-fit mechanism wherein the keys 404 will spread the spring arms 406 apart slightly and in this regard, the arms 406 may be formed so as to be biased slightly toward each other or the centerline of the connector component 400. This engagement occurs in a direction transverse, or crosswise to the centerline of the connector engagement, whereas in the previous embodiments, the spring arm retention has occurred in a direction parallel, or along, the centerline of the connector component.

Figure 27:
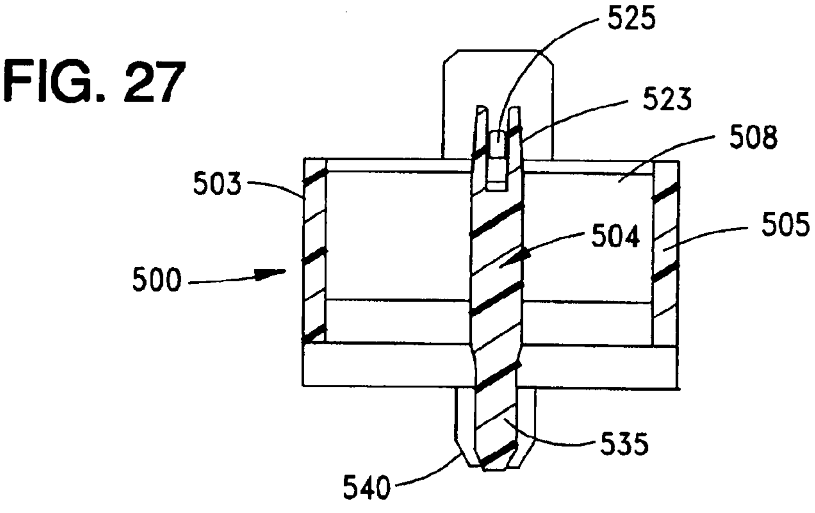
FIG. 27 is a sectional view of the connector housing of FIG. 23 taken along lines 27—27 thereof.
Figure 28:
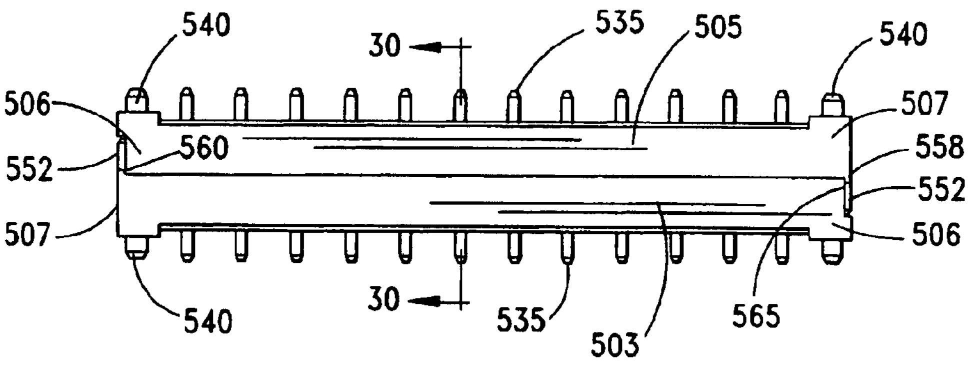
FIG. 28 is a side elevational view of two connector housing of FIG. 23 mated together.

FIGS. 23–30 illustrate another embodiment 500 of a connector component constructed in accordance with the principles of the present invention. This connector component 500 is also hermaphroditic, meaning that any two of the components will form an interengaging connector component pair as illustrated in FIG. 28. Each component 500 has an elongated housing 501 that may be defined by a plurality of walls 503, 504 and 505 that are preferably spaced apart from each other. These walls 503–505 are interconnected by ends 506, 507 and a plurality of transverse walls 508 that extend cross-wise of the connector housing 501. These cross or transverse walls 508 and the sidewalls and centerwall all cooperatively define a plurality of cavities 510 within the connector housing 501, each of which is intended to receive a terminal insert assembly 130.

Figure 23:
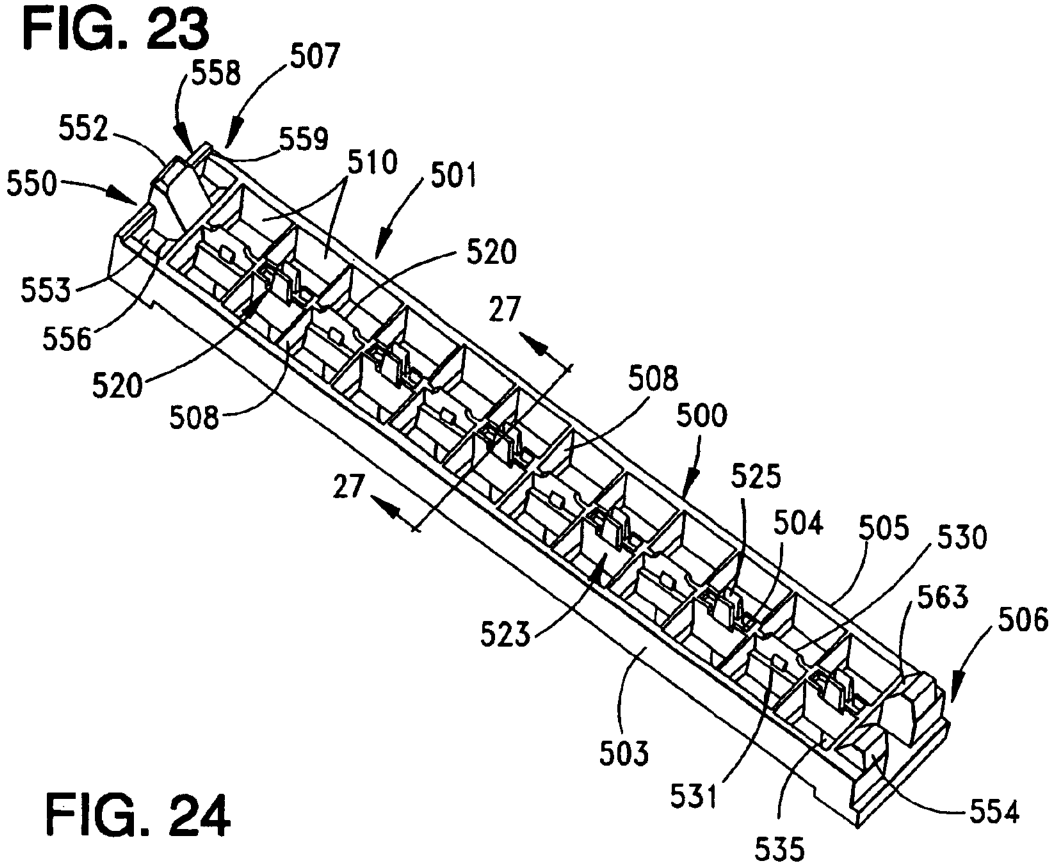
FIG. 23 is a perspective view of another embodiment of a hermaphroditic connector housing constructed in accordance with the principles of the present invention that utilizes another means of "zippering" the connector components into an out of engagement with each other.
Figure 24:
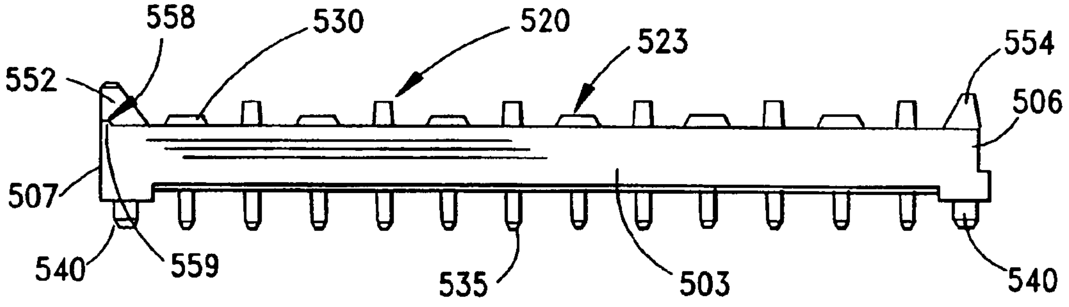
FIG. 24 is a side elevational view of the connector housing of FIG. 23.
Figure 25:
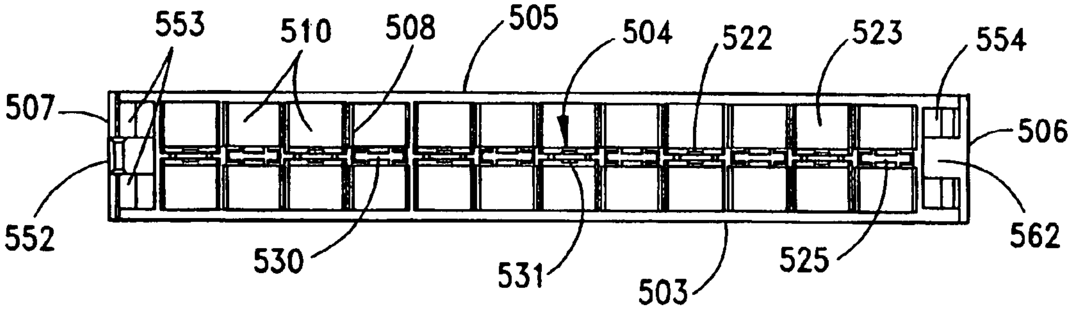
FIG. 25 is a top plan view of the connector housing of FIG. 23.
Figure 26:
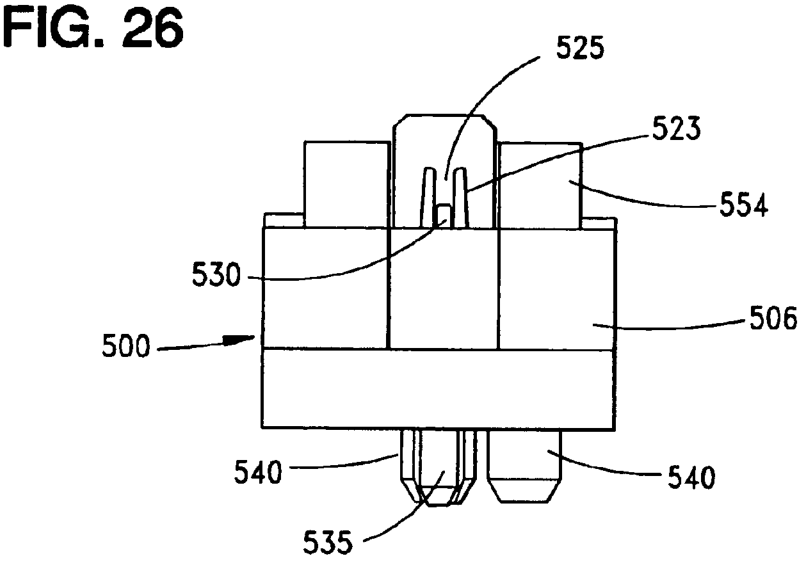
FIG. 26 is an end elevational view of the connector housing of FIG. 23.
Figure 29:
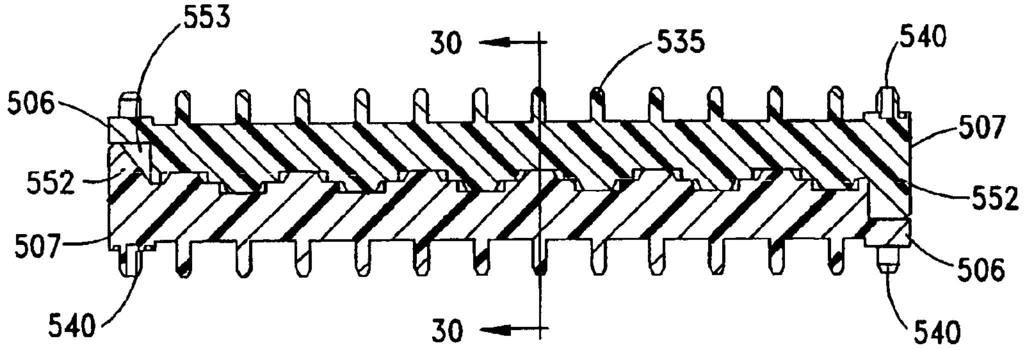
FIG. 29 is a longitudinal sectional view of the mated connector housing of FIG. 28.
Figure 30:
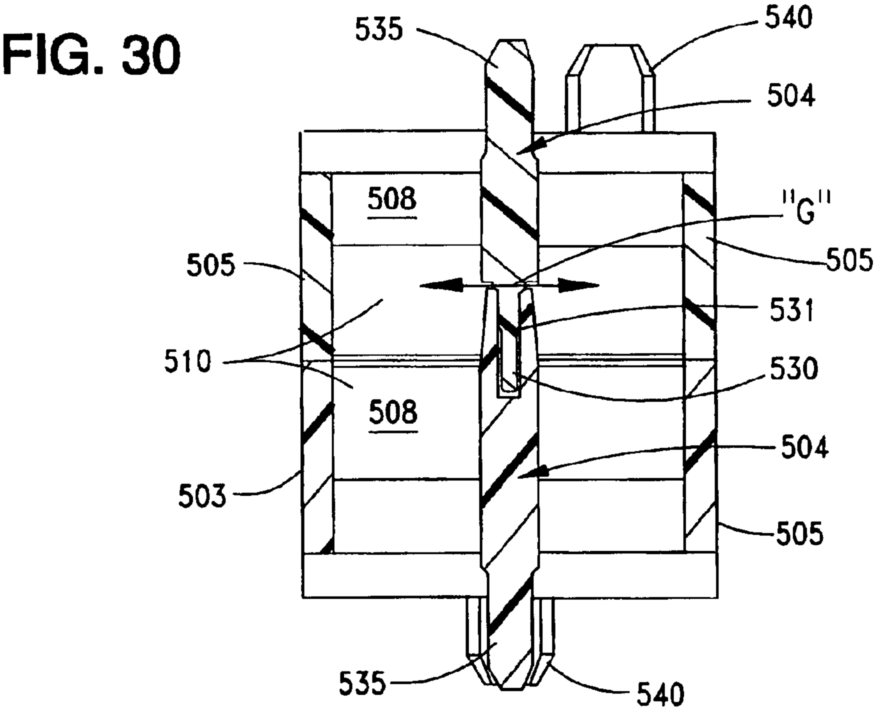
FIG. 30 is a transverse sectional view of the mated connector housings of FIG. 29 taken along lines 30—30 thereof.

In this connector component 500 and as illustrated in FIGS. 23–25, the engagement means 520 extends lengthwise of the connector housing 501 and preferably along the center wall 504 thereof. These engagement means 520 include alternating sets of posts 522 and spring arms 523. The spring arms 523 of this embodiment are separated by intervening slot 525 that runs lengthwise therebetween. This slot 525, as shown in FIGS. 23, 25 and 27 extends partially downwardly into the center wall 504 of the connector housing. The posts 522, as best illustrated in FIGS. 23 and 30, include a main portion 530 that is flanked by two side portions 531 which serve to engage the inner surfaces of the spring arms 523. This engagement spreads the spring arms 523 slightly apart and hence it is preferred that the spring between the two spring arms 523 (or the width of the intervening slot 525) is slightly less than the width of the post side portions 531. These side portions 531 may be formed with a slight taper so as to increase the engagement force as the posts 530 are inserted into corresponding opposing slots 525 between the spring arms 520. The line portion of this engagement will run cross wise or transverse of the connector housing, i.e., toward the side walls in the direction indicated at "G" in FIG. 30. FIG. 29 illustrates the longitudinal extent of this engagement.

Inasmuch as the exterior surfaces of the connector housings 500 are plated with a conductive material, the housings 500 preferably include a plurality of grounding legs 535, shown in the figures as posts. These posts 535 extend from approximately the center of segments of the center wall 504 that separate adjacent housing cavities 510 from each other on opposite sides of the centerline of the housing 500. These posts 535 are illustrated as being formed integrally with the center wall segments, but it is contemplated that they may include separate elements held within the centerwall(s) 504 and which extend downwardly therefrom. These posts 535 are also conductively plated and are inserted into holes, or vias, in circuit boards to which the connector housings are mounted, thereby making electrical contact between ground circuits on the boards and the connector plated surfaces.

Additional mounting elements, such as pegs 540 may be formed with the connector housings and used to locate and support the housings on the circuit boards. This embodiment is also provided with an engagement means 550 that permits the two connector housings 500 to be "zippered" together and apart, which facilitates the assembly of the device in which the housings are used. These engagement means 550 are disposed at the opposite ends 506, 507 of the connector housings 500 and include pairs of first and second "keys", 552, 554 which facilitate the "zippering" (at an angle) of the two connector housings 500 together. These keys 552, 554 permit the connector housings 500 to be aligned and engaged to each other from the ends 506, 507 of the connector housings 500.

Figure 31:
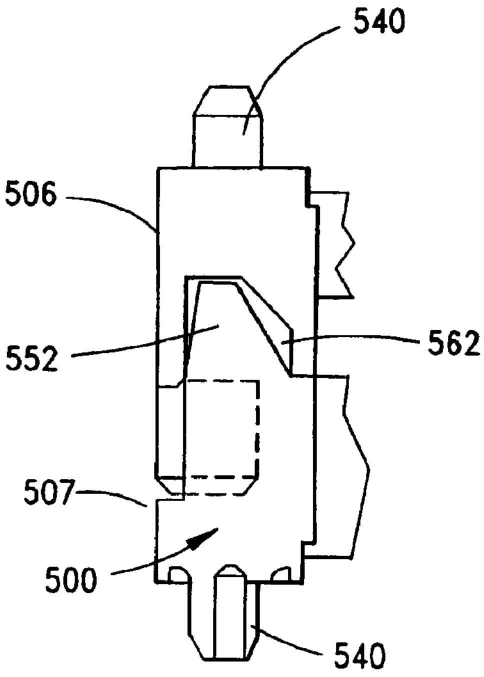
FIG. 31 is a partial sectional view of two ends of the connector housings engaged together showing the relationship between the housing keys and recesses.
Figure 32:
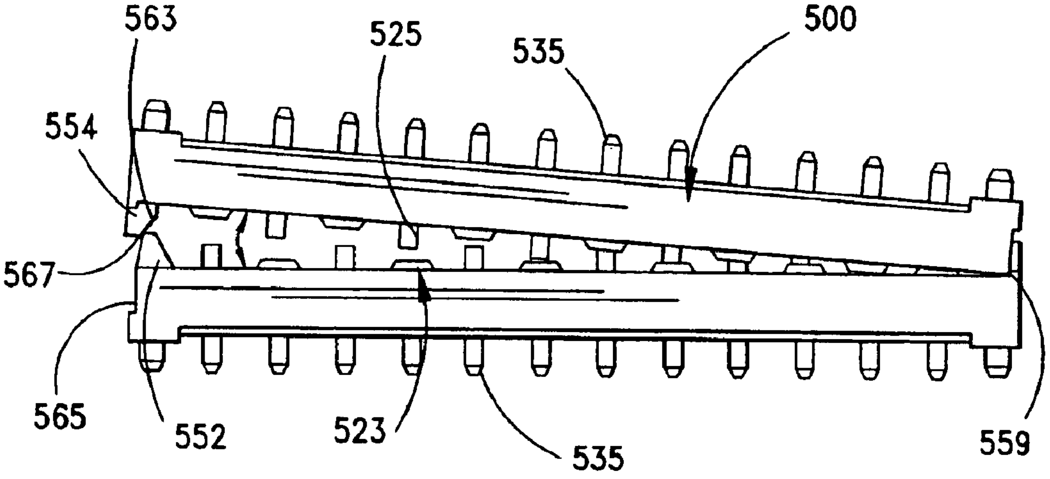
FIG. 32 is the one view as FIG. 28, but with two connector housings partially disengaged from each other.

Turning to FIGS. 29–31, the interaction among the engagement means 550 is shown in greater detail. The single key 552 is flanked by two recesses 553 which have interior angled surfaces 556 that are slightly larger than the angle at which the key 552 is formed. One end 507 of the connector housing 500 has a step, or shoulder 558 which serves to define a pivot point 559 about which the opposing connector housing end corner 560 will seat. (FIGS. 28 and 32). This shoulder 558 will hold the end corner 560 in place as the top connector housing is rotated into or out of engagement with the lower connector housing (FIG. 32) and the shoulder defines the angled radius and rotations. The shoulder 558 projects above the elevation of the sidewalls 503, 504 in order to obtain alignment of the two connector housings prior to their engagement.

The pair of opposite keys 554 are separated by an intervening slot 562 (FIGS. 25 and 31) that receives the single key 552. The keys 554 are chamfered at 563 to provide the keys 554 with entry into the end engagement recesses 553. The one end 506 of the connector housing 500 is also preferably notched to allow for the rotation of the keys 554 easily into the recesses 553 by removing material that might otherwise interfere with the top, or tip 567 of the key 554.

FIGS. 33–49 illustrate another embodiment of a connector assembly constructed in accordance with the present invention. This embodiment is similar to the previous embodiments described, except that the housing portions of the two connector are configured to provide additional shielding in the mating interface area, and a polarization feature is incorporated in the structure of the housing.

Figure 33:
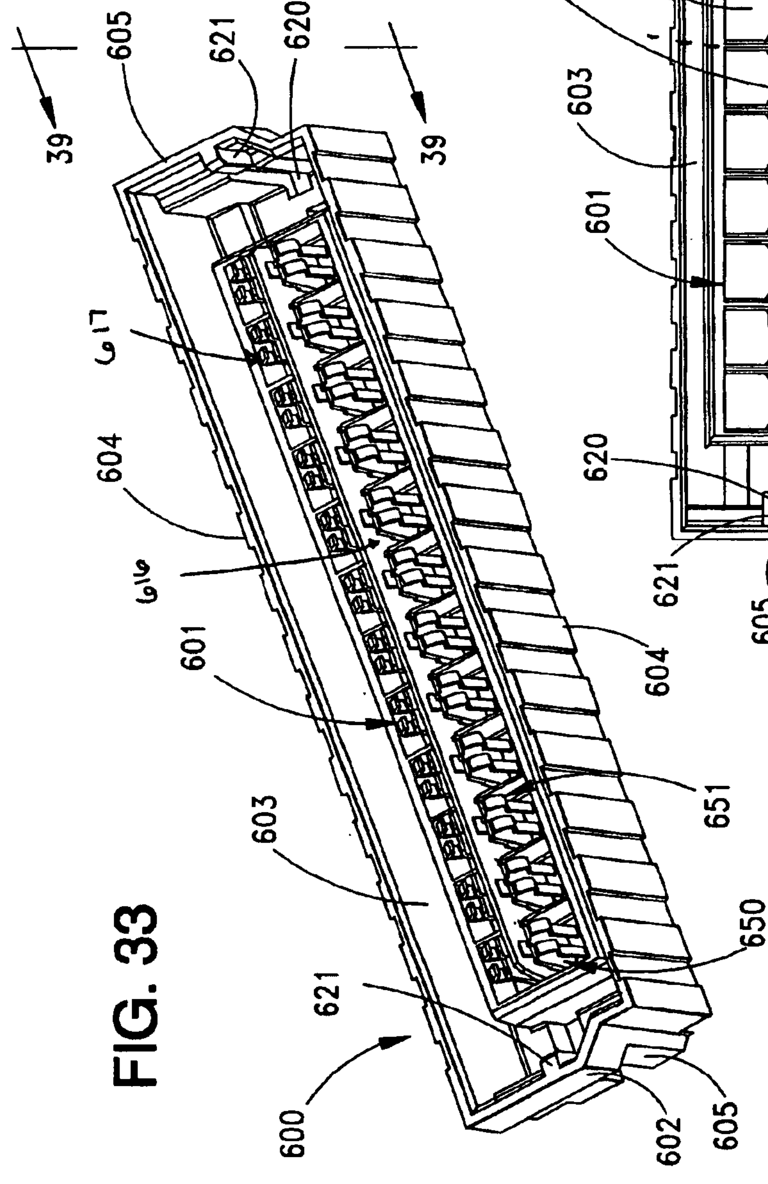
FIG. 33 is a perspective view of one connector component of another embodiment of a high speed connector assembly constructed in accordance with the principles of the present invention.
Figure 34:
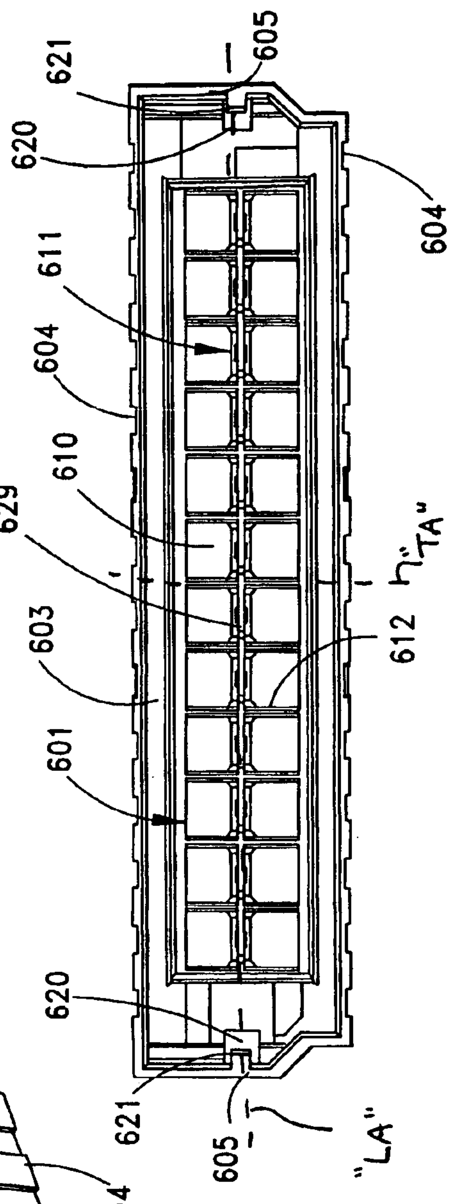
FIG. 34 is a top plan view of the housing of the connector component of FIG. 33 with the terminal assemblies removed therefrom for clarity.

FIG. 33 illustrates a female, or receptacle connector component 600 of the present invention which contains a plurality of individual terminal assemblies 650 in corresponding individual cavities 610. This connector component is preferably molded in one piece from an insulative material and, as illustrated, includes a central connector portion 616 defined in part by an interior wall 617 that is illustrated in a rectangular configuration having a plurality of individual cavities 610 (FIGS. 34 & 35) formed therein. The central connector portion 616 is itself partially enclosed, or surrounded, by an outer skirt, or shroud member 602 which includes a pair of sidewalls 604 and endwalls 605. The shroud member 602 and its walls are separated from the central connector portion 616 and its interior wall 617 by an intervening annular space 603 that defines a space into which a portion (insertion wall, or member 671) of the opposing male, or plug connector component 670 (FIGS. 36–38) of the connector assembly is received. Both the shroud member 602 and the opposing insertion wall 671 preferably have a one way symmetry, meaning that they are symmetrical about a transverse axis TA, but not about a longitudinal axis LA so as to provide the connector assembly with an integrated polarizing feature, so that both two connector components may only be assembled together in one way, even in a blind installation environment.

Figures 44, 45, 46, 47:
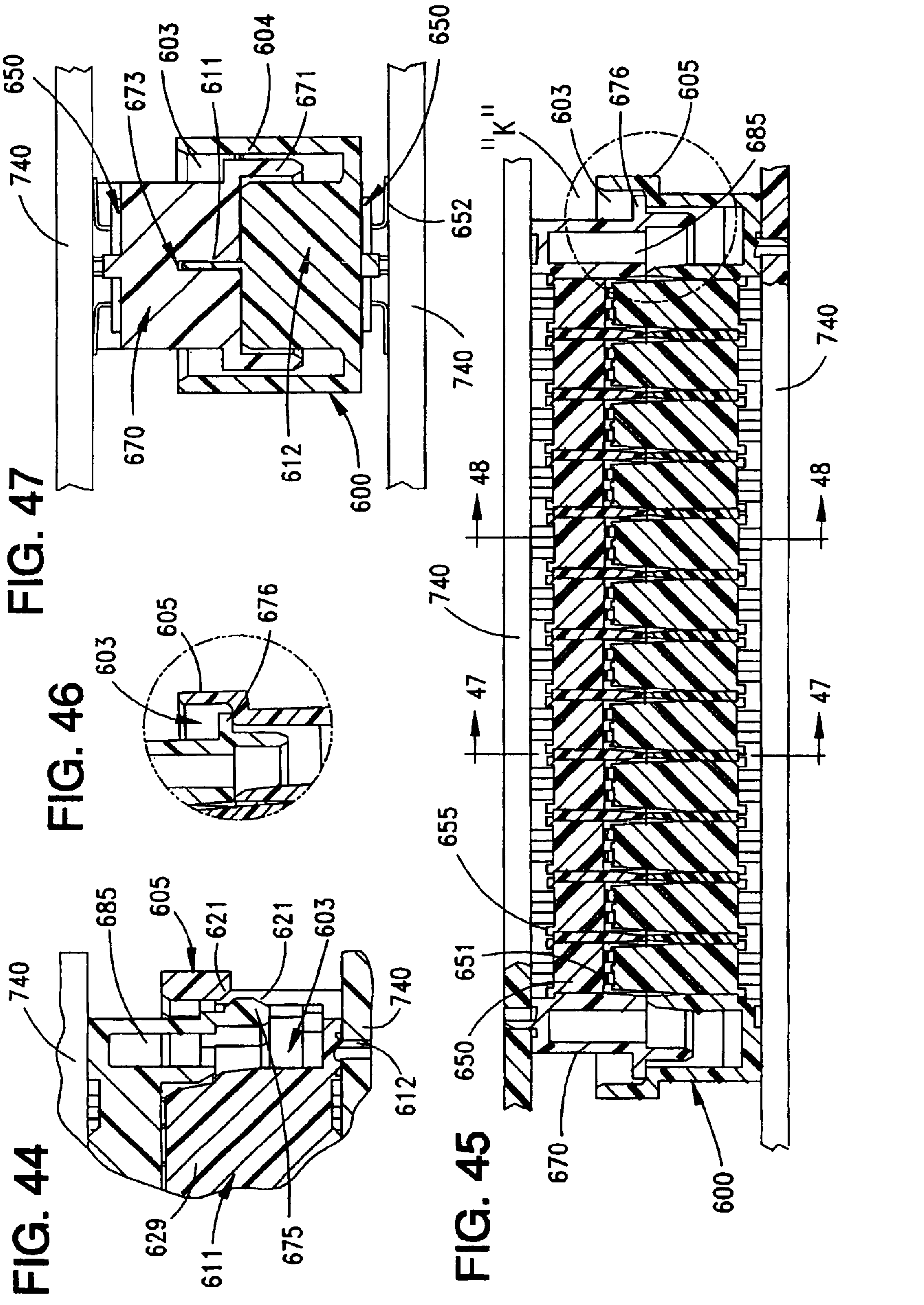
FIG. 44 is an enlarged detail view of the end engagement of the two connector components indicated at "J" in FIG. 43.
FIG. 45 is a sectional view taken longitudinally through both the connector components of FIGS. 33 and 36 after assembly together into an assembly interconnecting two circuit boards together, with the section being taken on a line slightly offset from the center line at the backs, or beginnings, of the terminal assemblies.
FIG. 46 is an enlarged detail view of the end engagement of the two connector components indicated at "K" in FIG. 45 and taken through one of the transverse walls thereof.
FIG. 47 is a cross-sectional view, taken transversely through the mated connector assembly of FIG. 45 along lines 47—47 thereof.
Figure 48:
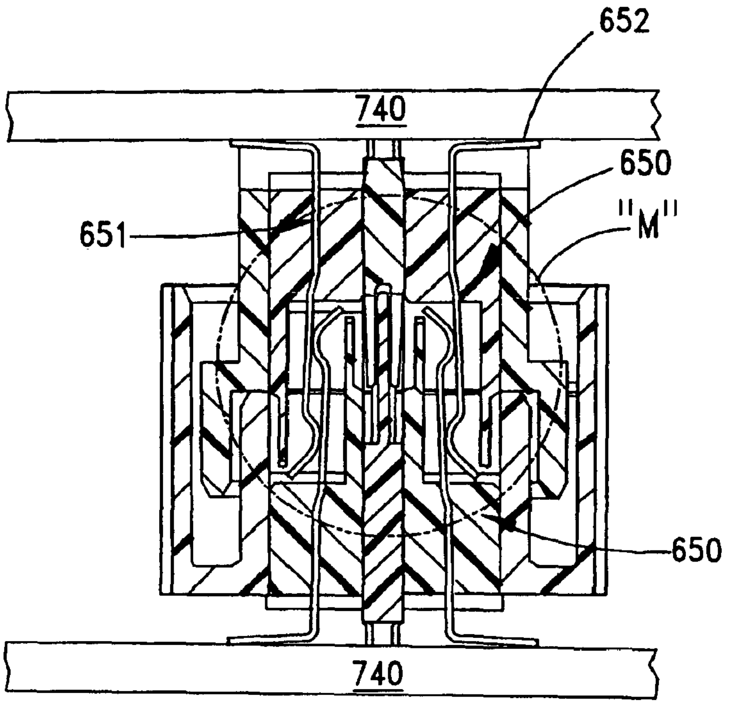
FIG. 48 is a cross-sectional view, taken transversely through the mated connector assembly of FIG. 45 along lines 48—48 thereof; and, FIG. 49 is an enlarged detail view of the mating interface of the terminal assemblies of the connector assembly indicated at "M" in FIG. 48.
Figure 49:
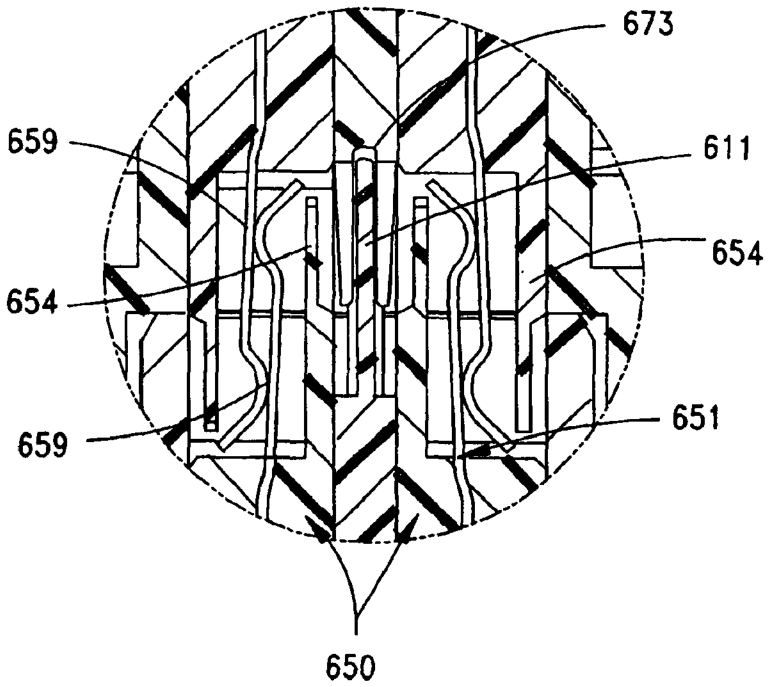

The central connector portion 616 rises up from the bottom of the connector component 600 to give the annular space a preselected depth. The central connector portion 616 further includes what may be considered as a skeleton or lattice-arrangement of the center wall 611 and a plurality of transverse walls 612 that cooperatively form the cavities 610. The exterior shroud endwalls 605 preferably include means for engaging the opposing male connector component 670, which will be explained in greater detail below. The receptacle connector 600 may further include mounting posts 6120 and grounding lugs 613 that may be received in openings, or vias on a circuit board 740, as shown in FIGS. 43 and 47, which may be soldered, or otherwise conductively attached to traces on the circuit board. Grounding of both connector components is accomplished by plating the exterior surfaces of the connector components with metal to form a conductive layer. Grounding contact in these connectors is accomplished by both face to face contact, such as is shown in FIGS. 43, 44 and 47 and by engagement of the center engagement members 691, 692 and 611. The grounding contact is made when the male connector component 670 is initially inserted into the well, or receptacle formed by the shroud wall.

The center wall 611 of the female connector component 600 includes a flat blade portion that extends upwardly and preferably past (or above) the tops of the terminal assemblies. This wall 611 is received within a gap or slot 673 (FIG. 47) of the opposing connector component 670. A pair of latching members, shown as lugs 621 in the Figures, are preferably formed with the outer shroud 603, and an opening 620 may be formed in the connector endwalls to provide clearance for the latching members, or lugs of the opposing connector component. Preferably the latching members 621 are aligned together with the center wall 611 (and the contact blade portion thereof) and are disposed along a common longitudinal axis so that the assembly and detachment of the two connector components may be accomplished in a "zippered" fashion, meaning that one end of the male connector component 670 may be placed on a similar end of the female connector component 600 and the male connector component rotated or rocked into firm engagement.

Turning now to FIGS. 41–42, the terminal assemblies 650 are shown in greater detail. Each terminal assembly 650 preferably includes a pair of conductive signal terminals 651 which have elongated body portions that extend between tails portions 652 and contact portions 659. Although the tail portions 652 are illustrated as surface mount tail portions, but will be understood that the tail portions may also take the form of through-hole tail portions. The body portions of the terminals are preferably captured, or otherwise formed within a dielectric body portion 653 of the terminal assembly, which as stated above, may be molded about the terminal pair. This body portion includes a base with a flange 655 encircling at least a portion thereof and the flange may terminate, as illustrated in upturned free ends 656. This flange assists in engaging the inner surfaces of the terminal cavities of the two connector components 600, 670 and in some instances, it may deform when the terminal assembly 650 is inserted into a housing cavity. Some of the corners of this body portion may be chamfered in order to provide a polarization aspect to the terminal assemblies. The body portion 653 may further include an upstanding back wall portion 654, that provides some measure of dielectric between the terminals and the intervening center wall 611, 673 of the connector components.

Figure 36:
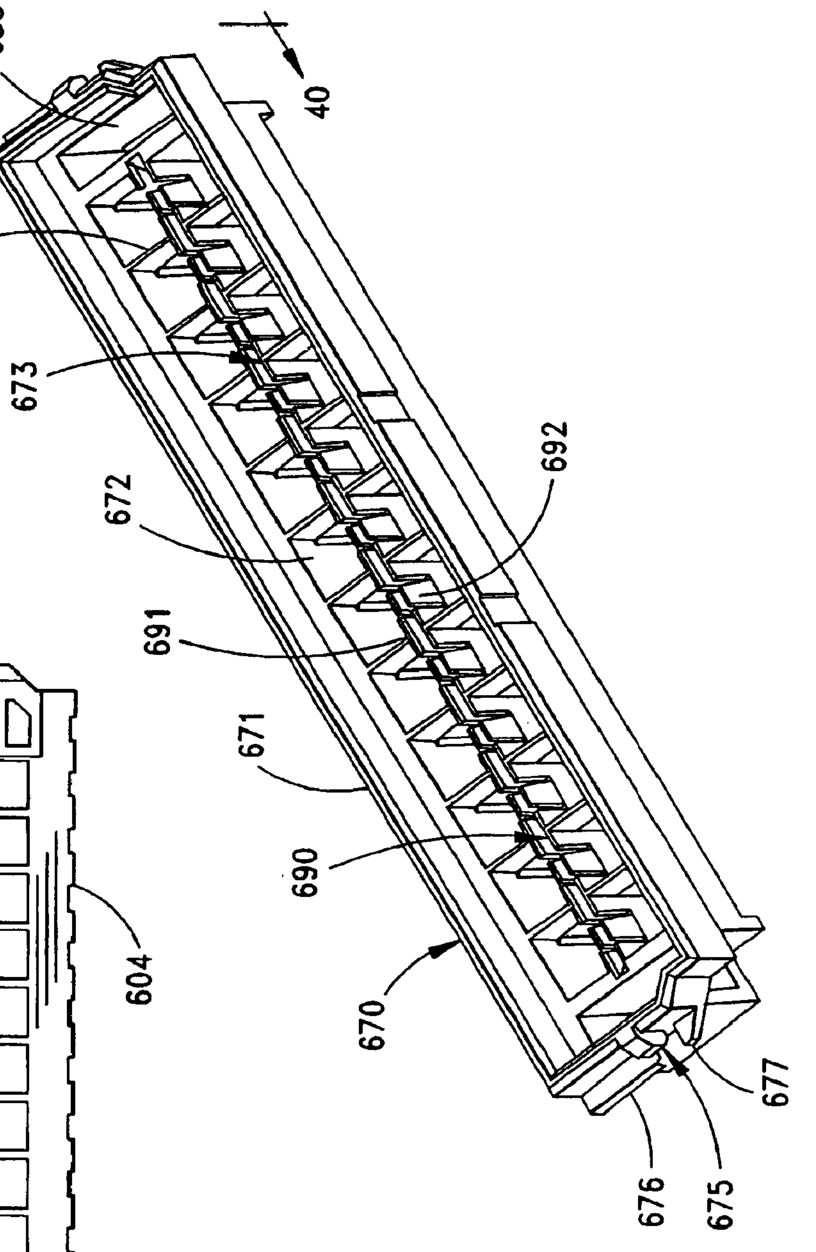
FIG. 36 is a perspective view of an opposing connector component that mates with the connector component of FIG. 33 to form a high speed connector assembly of the present invention, with terminal assemblies removed for clarity.
Figure 37:
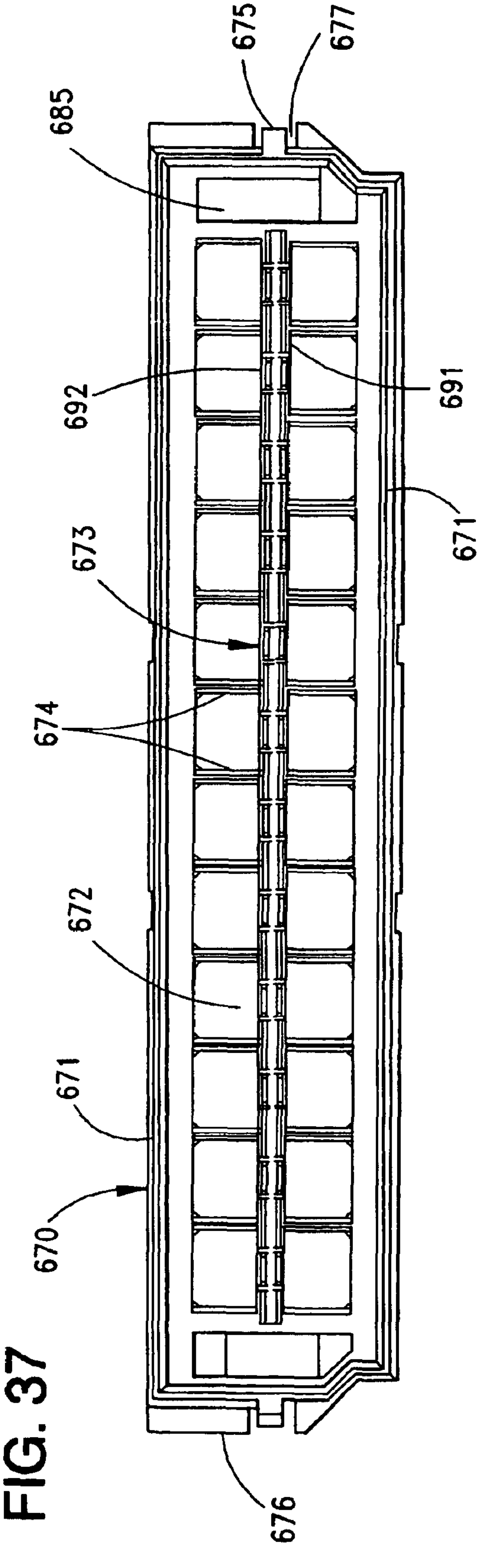
FIG. 37 is a top plan view of the connector component of FIG. 36.
Figure 38:
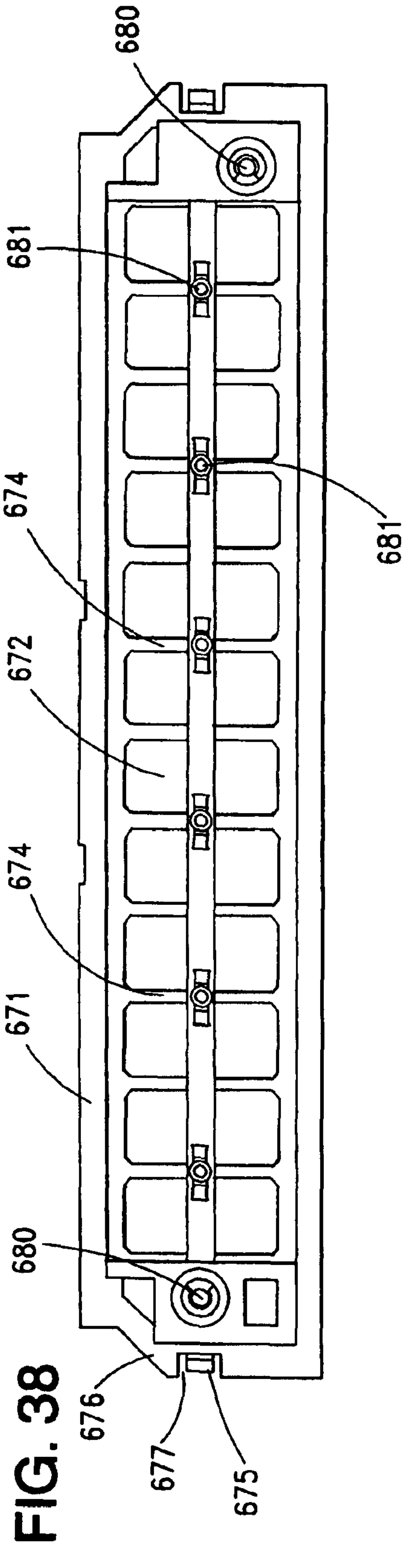
FIG. 38 is a bottom plan view of the connector component of FIG. 36.

FIGS. 36–38 illustrate the male connector component 670 that fits into and engages the female connector component 600. This connector component 670 also has an insulative housing formed by sidewalls 671 and a center wall, or member 673. A plurality of transverse walls 674 extend inwardly toward the center wall 673 and define a plurality of terminal assembly-receiving cavities 672. The sidewalls 671 extend above the center wall 673 and above the tops of the terminal assemblies 650 so that when mated to the other connector component 600, it (they) projects into the intervening space 603, as shown in FIG. 47. The shroud walls of the female connector component 600 serve to protect the contacts, and the internal ledge thereof serves to provide a plat form on which the end of an opposing connector component may be rotated.

The male connector component 670 further includes engagement means formed at its end walls. As shown in FIGS. 36, 37 & 44, this includes a flat flange 676, with a notch, or slot 677 formed therein and a latching lug 675. This latching lug 675 is disposed on the end wall of the male connector 670 in alignment with the latching lug 621 of the receptacle connector 600 and preferably in alignment with the center wall 673 and is associated slot 690 of the connector component 670. As shown in FIGS. 43 and 44, the latching lug 621 is received within the opening 620 of the female connector component 600 and is positioned below its latching lug 621. Similarly, the male connector component flange 676 abuts against an opposing ledge formed in the inner surface of the shroud end wall 605. The openings 620 and 685 (FIG. 37) also assist in the housing material flowing through the mold cavity during production of the connector components.

Figure 35:
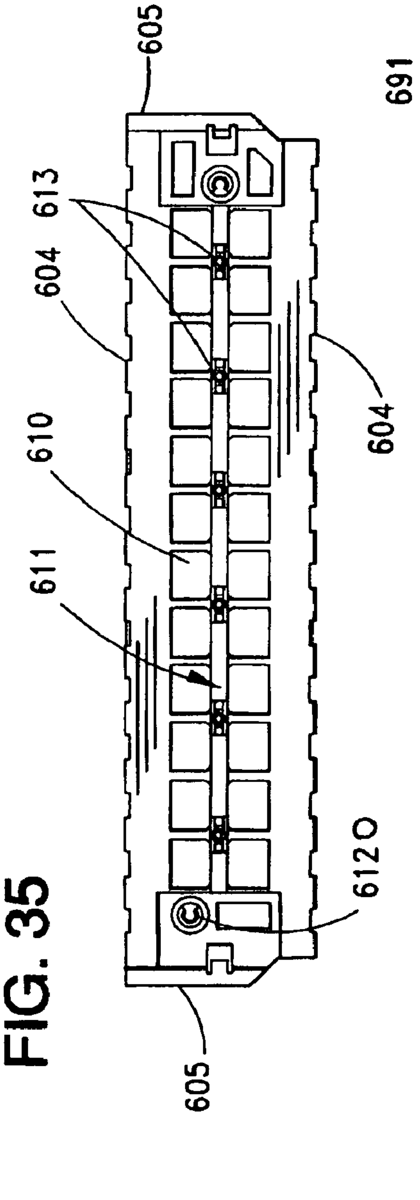
FIG. 35 is a bottom plan view of the housing of the connector component of FIG. 33 with the terminal assemblies removed therefrom for clarity.

As shown in FIGS. 36 and 37, the male connector component 670 includes an engagement means 673 that runs lengthwise, or longitudinally of the component. This engagement means includes a central slot 690 that is flanked by a plurality of spring arms, or other similar frictional engagement members 691, 692. These spring arms 691, 692 have varying widths so that some 692 are narrow, while others 692 are wide. The wide spring arms 691 are those which preferably abut the transverse walls 674 of the male connector component, while the narrow spring arms 692 lie in an alternating fashion between pairs of the wide spring arms 691. As such, the narrow spring arms 692 will be capable of greater flexure than the wide spring arms 691. The male connector component also has, as illustrated in FIG. 35, mounting posts 680 and grounding lugs 681 that are received within holes or vias, as shown in FIG. 43.

While the preferred embodiment of the invention have been shown and described, it will be apparent to those skilled in the art that changes and modifications may be made therein without departing from the spirit of the invention, the scope of which is defined by the appended claims.

What is claimed is:

1. A differential signal terminal assembly for insertion into an opening of a connector housing, the connector housing including an interior surface that encompasses the connector housing opening, the interior surface further being coated with a conductive material that when connected to a ground circuit, forms a reference ground that surrounds the terminal assembly, said terminal assembly including:

an insulative body with a base portion and an upstanding wall portion, the base portion having a first width and the wall portion having a second width, the second width being less than the first width, thereby giving the insulative body an L-shaped configuration when viewed from a side thereof; and, a pair of conductive differential signal terminals, each of said terminals including a body portion, a tail portion and a contact portion, the terminal body portions being supported in a spaced-apart fashion by said insulative body portion, the terminal tail portions extending out from said body base portion and the terminal contact portions being disposed along said upstanding wall portion, said upstanding wall portion including a pair of slots disposed therein, portions of said terminal body portions extending lengthwise in said slots and said terminal contact portions being biased outwardly so that they extend partially out of said slots.

2. The differential signal terminal assembly of claim 1, wherein each of said terminals has an L-shaped configuration when viewed from a side thereof.

3. The differential signal terminal assembly of claim 1, wherein said terminal tail and body portions extend at angles to each other.

4. The differential signal terminal assembly of claim 1, wherein said terminal body portion interconnect said terminal tail and contact portions together.

5. The differential signal terminal assembly of claim 1, wherein said terminal tail and contact portions are disposed at opposing ends of said terminals.

6. The differential signal terminal assembly of claim 1, wherein said terminal tail portions include surface mount tails.

7. The differential signal terminal assembly of claim 1, wherein terminal contact portions include semi-circular contact surfaces.

8. The differential signal terminal assembly of claim 1, wherein said terminals are vertically cantilevered from said insulative base body portion.

9. The differential signal terminal assembly of claim 8, wherein said terminal contact portions are biased so that they extend away from said insulative body upstanding wall portion.

10. The differential signal terminal assembly of claim 1, wherein said insulative body portion is formed from a dieletric material.

11. The differential signal terminal assembly of claim 1, wherein said terminals are stitched into said insulative body portion.

12. The differential signal terminal assembly of claim 1, wherein said terminals are insulative body portion is molded around said terminals.

13. A differential signal pair terminal assembly, comprising:

an insulative body portion including a base portion and a wall portion extending therefrom, the wall portion having a pair of slots formed therein extending for a length of said wall portion; and, a pair of conductive terminals for carrying differential signals, the terminals having tail portions and body portions that terminate in free ends, the free ends of said terminals including contact portions, the terminal body portions being supported by the insulative body base portion, the terminal free ends extending from said insulative body base portion in a cantilevered fashion, portions of said terminal body portions extending lengthwise within said insulative body wall portion slots.

14. The differential signal terminal assembly of claim 13, wherein said contact portions are biased so that they extend at least partially outwardly from said slots.

15. The differential signal terminal assembly of claim 13, wherein terminal contact portions include semi-circular contact surfaces.

16. The differential signal terminal assembly of claim 13, wherein said terminal tail portions include surface mount tails.

17. The differential signal terminal assembly of claim 16, wherein said terminal tail portions extend parallel to said insulative body base portion and said terminal body portions extend parallel to said insulative body wall portion.

18. The differential signal terminal assembly of claim 13, wherein said terminal tail portions extend in a first direction and said terminal body portion extend in a second direction, at an angle to said first direction.

19. The differential signal terminal assembly of claim 13, wherein said insulative body portion has an L-shaped configuration when viewed from a side thereof.

20. The differential signal terminal assembly of claim 13, wherein said insulative body base portion has a first width and said insulative body wall portion has a second width that is less than the first width, the difference in widths defining a stepped configuration of said insulative body portion.

21. A differential signal terminal assembly for insertion into an opening of a connector housing, the connector housing including an interior surface that encompasses the connector housing opening, the interior surface further being coated with a conductive material that when connected to a ground circuit, forms a reference ground that surrounds the terminal assembly, said terminal assembly including:

an insulative body with a base portion and an upstanding wall portion, the base portion having a first width and the wall portion having a second width, the second width being less than the first width, thereby giving the insulative body an L-shaped configuration when viewed from a side thereof;

a pair of conductive differential signal terminals, each of said terminals including a body portion, a tail portion and a contact portion, the terminal body portions being supported in a spaced-apart fashion by said insulative body portion, the terminal tail portions extending out from said body base portion and the terminal contact portions being disposed along said upstanding wall portion, and said difference in said first and second widths of said insulative body portion defining a cavity when said terminal assembly is inserted into said connector housing opening, the cavity receiving a portion of another terminal assembly of an opposing, mating connector.

* * * * *